US012796060B2

(12) United States Patent
Kim et al.

(10) Patent No.: US 12,796,060 B2
(45) Date of Patent: Nov. 10, 2026

(54) SEMICONDUCTOR DEVICE HAVING DOPED MONOCRYSTALLINE SEMICONDUCTOR LAYER, METHOD FOR MANUFACTURING THE SAME, AND ELECTRONIC SYSTEM INCLUDING THE SAME

(71) Applicant: SAMSUNG ELECTRONICS CO., LTD., Suwon-si (KR)

(72) Inventors: Junhyoung Kim, Suwon-si (KR); Joonyoung Kwon, Suwon-si (KR); Jiyoung Kim, Suwon-si (KR); Sukkang Sung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 350 days.

(21) Appl. No.: 18/541,229

(22) Filed: Dec. 15, 2023

(65) Prior Publication Data

US 2024/0405091 A1 Dec. 5, 2024

(30) Foreign Application Priority Data

Jun. 1, 2023 (KR) ........................ 10-2023-0071090

(51) Int. Cl.

| | |
|---|---|
| ***H10D 64/66*** | (2025.01) |
| ***H10B 41/10*** | (2023.01) |
| ***H10B 41/35*** | (2023.01) |
| ***H10B 43/10*** | (2023.01) |
| ***H10B 43/35*** | (2023.01) |

(Continued)

(52) U.S. Cl.
CPC ......... *H10D 64/66* (2025.01); *H10P 14/3456* (2026.01); *H10P 14/3458* (2026.01); *H10W 20/074* (2026.01); *H10B 41/10* (2023.02); *H10B 41/35* (2023.02); *H10B 43/10* (2023.02); *H10B 43/35* (2023.02)

(58) Field of Classification Search
CPC ...... H10P 14/3458; H10B 41/27; H10B 43/27
See application file for complete search history.

(56) References Cited

U.S. PATENT DOCUMENTS 10,879,269 B1 * 12/2020 Zhang .................... H10B 51/20
2020/0185408 A1 6/2020 Song et al.
2021/0143179 A1 5/2021 Song et al.
(Continued)

FOREIGN PATENT DOCUMENTS

CN 113937106 A 1/2022
CN 114300474 A 4/2022
(Continued)

OTHER PUBLICATIONS

Extended European Search Report in European Appln. No. 24154107.7, mailed on Jul. 19, 2024, 9 pages.

*Primary Examiner* — Nduka E Ojeh
(74) *Attorney, Agent, or Firm* — Fish & Richardson P.C.

(57) ABSTRACT

A semiconductor device includes a gate stacking structure including alternating gate electrodes and insulation layers on an insulation portion, a channel structure crossing the insulation portion and extending through the gate stacking structure, and a horizontal conductive layer connected to the channel structure between the insulation portion and the gate stacking structure, the horizontal conductive layer including a doped monocrystalline semiconductor layer having a dopant.

20 Claims, 24 Drawing Sheets

(51) Int. Cl.
*H10P 14/20* (2026.01)
*H10W 20/00* (2026.01)

(56) References Cited

U.S. PATENT DOCUMENTS

| | | | | |
|---|---|---|---|---|
| 2021/0143180 | A1 | 5/2021 | Song et al. | |
| 2021/0375914 | A1* | 12/2021 | Zhang .................... | H10B 43/27 |
| 2021/0391315 | A1 | 12/2021 | Zhang | |
| 2022/0045083 | A1 | 2/2022 | Sim et al. | |
| 2022/0262818 | A1 | 8/2022 | Zhang et al. | |
| 2022/0302149 | A1 | 9/2022 | Zhang et al. | |
| 2022/0310162 | A1 | 9/2022 | Wu et al. | |
| 2022/0328523 | A1 | 10/2022 | Song et al. | |
| 2022/0359564 | A1* | 11/2022 | Oh .......................... | H10B 41/27 |
| 2023/0005944 | A1 | 1/2023 | Zhang et al. | |
| 2023/0059524 | A1 | 2/2023 | Wu et al. | |
| 2024/0090223 | A1 | 3/2024 | Song et al. | |
| 2025/0380432 | A1* | 12/2025 | Yamasaki .............. | H10B 43/27 |

FOREIGN PATENT DOCUMENTS

| | | |
|---|---|---|
| JP | 2022-032042 | 2/2022 |
| WO | WO 2020/113578 | 6/2020 |
| WO | WO 2021/237492 | 12/2021 |

* cited by examiner (a)

(b)

SEMICONDUCTOR DEVICE HAVING DOPED MONOCRYSTALLINE SEMICONDUCTOR LAYER, METHOD FOR MANUFACTURING THE SAME, AND ELECTRONIC SYSTEM INCLUDING THE SAME

CROSS-REFERENCE TO RELATED APPLICATION

This application claims priority to and the benefit of Korean Patent Application No. 10-2023-0071090, filed in the Korean Intellectual Property Office on Jun. 1, 2023, the entire contents of which are incorporated herein by reference.

BACKGROUND

1. Field

The present disclosure relates to a semiconductor device, a manufacturing method thereof, and an electronic system including the same.

2. Description of the Related Art

In an electronic system implementing a data storage, a semiconductor device may be capable of storing high-capacity data. Accordingly, a method for increasing a data storage capacity of a semiconductor device is being researched. For example, one method for increasing the data storage capacity of a semiconductor device may include three-dimensionally arranged memory cells instead of two-dimensionally arranged memory cells.

SUMMARY

A semiconductor device according to an embodiment includes a gate stacking structure having a plurality of gate electrodes and a plurality of insulation layers alternately stacked on an insulation portion, a channel structure extending in a cross direction crossing the insulation portion through the gate stacking structure, and a horizontal conductive layer connected to the channel structure between the insulation portion and the gate stacking structure and including a doped monocrystalline semiconductor layer having a dopant.

A manufacturing method of a semiconductor device according to an embodiment includes forming a first doped monocrystalline semiconductor layer having a first conductivity type on a semiconductor substrate, forming a stacking structure on the first doped monocrystalline semiconductor layer, such that the stacking structure includes alternating insulation layers and sacrificial layers, forming a channel structure penetrating the stacking structure and the first doped monocrystalline semiconductor layer, forming an opening penetrating the stacking structure to expose a part of the first doped monocrystalline semiconductor layer, such that a first part of the first doped monocrystalline semiconductor layer is not exposed and a second part of first doped monocrystalline semiconductor layer is exposed, doping a second conductivity type dopant to the second part of the first doped monocrystalline semiconductor, such that the first part of the first doped monocrystalline semiconductor layer is a first conductivity type region and the second part of the first doped monocrystalline semiconductor layer is a second conductivity type region, replacing the sacrificial layers with gate electrodes, removing the semiconductor substrate, and forming a doped polycrystalline semiconductor layer on the doped monocrystalline semiconductor layer, the channel structure, and the gate stacking structure.

An electronic system according to an embodiment includes a main substrate, a semiconductor device on the main substrate, and a controller electrically connected to the semiconductor device on the main substrate, wherein the semiconductor device includes a gate stacking structure having alternating gate electrodes and insulation layers on an insulation portion, a channel structure crossing the insulation portion and extending through the gate stacking structure, and a horizontal conductive layer connected to the channel structure between the insulation portion and the gate stacking structure, the horizontal conductive layer including a doped monocrystalline semiconductor layer with a dopant the above-described semiconductor device located on the main substrate, and a controller electrically connected to the semiconductor device on the main substrate.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, a semiconductor device and a manufacturing method thereof according to an embodiment are described in detail with reference to FIGS. 1-3 and FIGS. 4A-4I.

Figure 1:
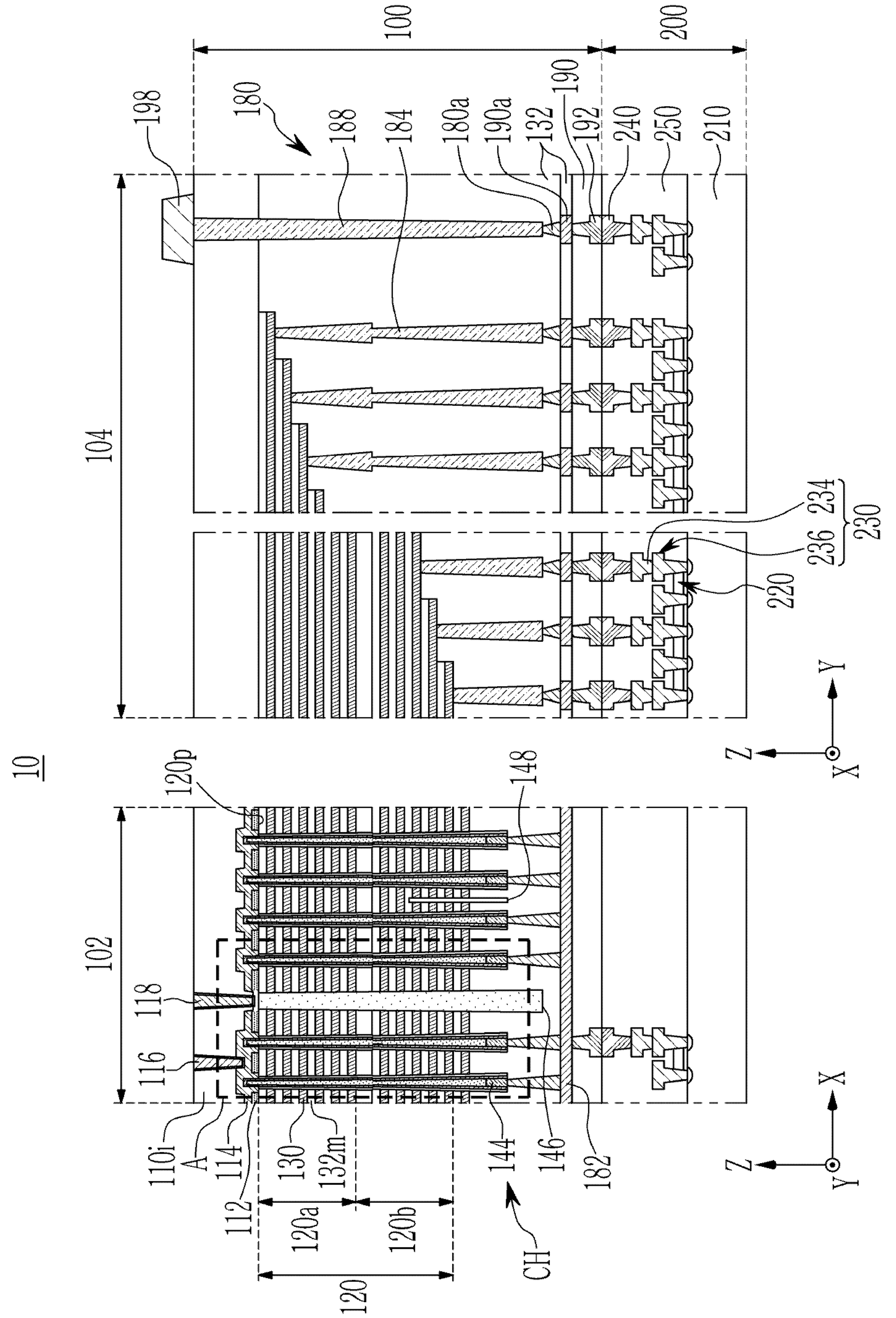
FIG. 1 is a cross-sectional view of a semiconductor device according to an embodiment.
Figure 2:
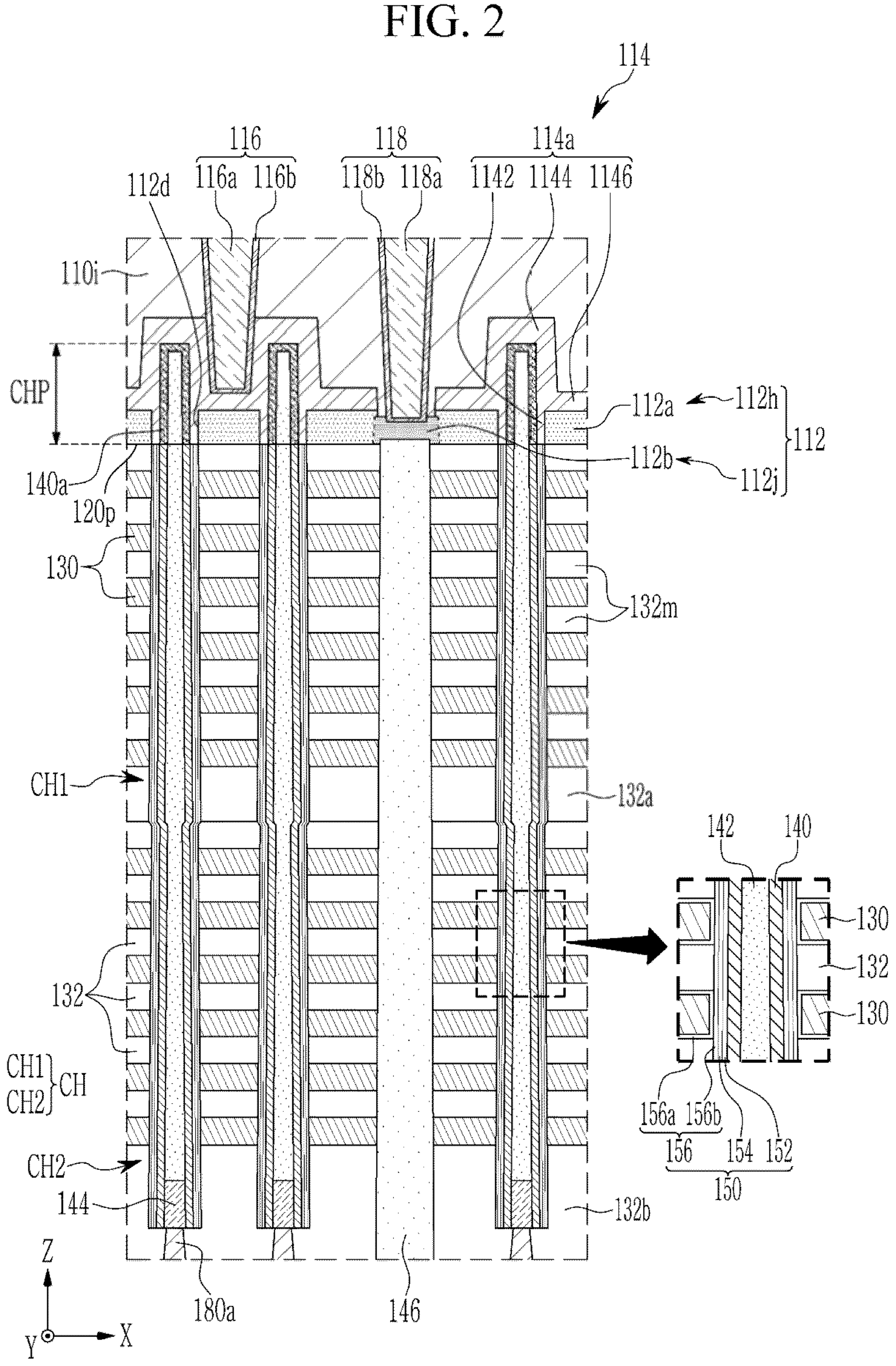
FIG. 2 is an enlarged cross-sectional view of portion A of FIG. 1.

FIG. 1 is a cross-sectional view schematically showing a semiconductor device according to an embodiment. FIG. 2 is an enlarged cross-sectional view showing portion A of FIG. 1. For brief illustration and clarification, in FIG. 1, FIG. 2, and FIG. 4I, a first contact portion 116 is arbitrarily shown to be adjacent to a channel structure CH adjacent to a separation structure 146, but the location of the first contact portion 116 may be variously modified.

Referring to FIG. 1 and FIG. 2, a semiconductor device 10 according to an embodiment may include a cell region 100 provided with a memory cell structure and a circuit region 200 provided with a peripheral circuit structure for controlling an operation of the memory cell structure. In this case, the semiconductor device 10 may be a bonding semiconductor device or a junction semiconductor device of a chip to chip (C2C) structure in which the cell region 100 and the circuit region 200 may be bonding semiconductor devices bonded to each other by a wafer bonding method (e.g., hybrid bonding). For example, the circuit region 200 and the cell region 100 may be portions corresponding to a first structure 1100F and a second structure 1100S of a semiconductor device 1100 included in an electronic system 1000 shown in FIG. 10, respectively. In another example, the circuit region 200 and the cell region 100 may be portions including a first structure 4100 and a second structure 4200 of a semiconductor chip 2200 shown in FIG. 12, respectively.

Here, the circuit region 200 may include a peripheral circuit structure formed on a first substrate 210, and the cell region 100 may include a gate stacking structure 120 and a channel structure CH formed in a cell array region 102 as a memory cell structure. The circuit region 200 may include a first wire portion 230 electrically connected to the peripheral circuit structure, and the cell region 100 may include a second wire portion 180 electrically connected to the memory cell structure.

In an embodiment, the cell region 100 may be located on the circuit region 200. Accordingly, since an area corresponding to the circuit region 200 may not need to be secured separately from the cell region 100, an area of the semiconductor device 10 may be reduced.

The circuit region 200 may include a first substrate 210, a circuit element 220 and a first wire portion 230 formed on the first substrate 210, and a first bonding structure 240 on the first wire portion 230 and facing the cell region 100. In addition, a first insulation layer 250 covering the first substrate 210, the circuit element 220, and the first wire portion 230 may be further included.

The first substrate 210 may be a semiconductor substrate including a semiconductor material. For example, the first substrate 210 may be a semiconductor substrate made of a semiconductor material or may be a semiconductor substrate on which a semiconductor layer is formed on a base substrate. For example, the first substrate 210 may include a single crystalline or polycrystalline silicon, epitaxial silicon, germanium, or silicon-germanium, silicon-on-insulator (silicon on insulator, SOI), or germanium-on-insulator (germanium on insulator, GOI), etc.

The circuit element 220 formed on the first substrate 210 may include any of various circuit elements that control an operation of the memory cell structure provided in the cell region 100. For example, the circuit element 220 may constitute a peripheral circuit structure, e.g., a decoder circuit (reference numeral 1110 in FIG. 10), a page buffer (reference numeral 1120 in FIG. 10), and a logic circuit (reference numeral 1130 in FIG. 10). The circuit element 220 may include, e.g., a transistor. For example, the circuit element 220 may include active elements, e.g., transistors, but also passive elements, e.g., capacitors, resistors, and inductors.

The first wire portion 230 located on the first substrate 210 may electrically connect the circuit element 220 and the first bonding structure 240. In an embodiment, the first wire portion 230 may include a plurality of wiring layers 236 spaced apart with a first insulation layer 250 therebetween and connected by a contact via 234 to form a desired path. The wiring layer 236 or the contact via 234 may include any of various conductive materials, and the first insulation layer 250 may include any of various insulating materials, e.g., silicon oxide and silicon nitride. The first insulation layer 250 may include one or a plurality of insulation layers.

The cell region 100 may include a cell array region 102 and a connection region 104. In the cell array region 102, a gate stacking structure 120 and a channel structure CH may be located on the insulation portion 110*i*. The connection region 104 may be disposed at a periphery of the cell array region 102. In the connection region 104, a structure or a wire for connecting the gate stacking structure 120 and/or the channel structure CH formed in the cell array region 102 to the circuit region 200 or the external circuit may be located.

In this specification, if there is no separate description, an upper portion or a lower portion refers to an upper portion or a lower portion in a manufacturing process. For example, if there is no separate description, for the gate stacking structure 120, the channel structure CH, etc., an upper portion refers to a portion located far from the insulation portion 110*i*, and the lower portion refers to a portion located close to the insulation portion 110*i*. Unless otherwise specified, for a doped polycrystalline semiconductor layer 114 and the insulation portion 110*i*, an upper portion refers to an upper portion of FIG. 1 and FIG. 2 or refers to a portion located far from the circuit region 200, and a lower portion refers to a lower portion of FIG. 1 and FIG. 2 or refers to a portion located close to the circuit region 200.

The insulation portion 110*i* may be an insulation member or an insulation layer including an insulating material. For example, the insulation portion 110*i* may include silicon oxide, silicon nitride, silicon oxynitride, or a combination thereof. In an embodiment, the insulation portion 110*i* may be formed after removing a semiconductor substrate (reference numeral 110 in FIG. 4A), etc. located on a first surface 120*p* of the gate stacking structure 120 and forming horizontal conductive layers 112 and 114. This will be described in more detail later. Here, the first surface 120*p* of the gate stacking structure 120 may be a bottom surface of the gate stacking structure 120 in a manufacturing process and may be an upper surface of the gate stacking structure 120, as illustrated in in FIG. 1 and FIG. 2. In other words, the first surface 120*p* may be an outer surfaces of the gate stacking structure 120 that faces the horizontal conductive layers 112 and 114 and faces away from the first substrate 210 (i.e., a surface on which the horizontal conductive layers 112 and 114 are formed in FIG. 1 and FIG. 2).

The gate stacking structure 120 may be located on the insulation portion 110*i* (i.e., on the horizontal conductive layers 112 and 114 located on the insulation portion 110*i*). The gate stacking structure 120 may include a plurality of cell insulation layers 132 and a plurality of gate electrodes 130 that are alternately stacked.

The cell insulation layer 132 may include an interlayer insulating layer 132*m* located between two gate electrodes 130 adjacent within the gate stacking structure 120, and upper insulation layers 132*a* and 132*b* located at an upper side (a lower side in FIG. 1) of the gate stacking structure 120. For a brief illustration, FIG. 1 illustrates that the cell insulation layer 132 in the connection region 104 is provided as one without a boundary, except for a portion where a connection wire 190*a* is located. However, the cell insulation layer 132 located in the connection region 104 may have any of various structures including one or a plurality of insulation layers.

The gate electrode 130 may include any of various conductive materials. For example, the gate electrode 130 may include a metallic material, e.g., tungsten (W), copper (Cu), aluminum (Al), polycrystalline silicon, metal nitride (e.g., titanium nitride (TiN), tantalum nitride (TaN), etc.), or combinations thereof. As shown in an enlarged view in FIG. 2, a portion of a blocking layer 156 (e.g., a first blocking layer 156*a*) made of an insulating material may be located outside the gate electrode 130. The cell insulation layer 132 may include any of various insulating materials. For example, the cell insulation layer 132 may include silicon oxide, silicon nitride, silicon oxynitride, or a low dielectric constant material having a smaller dielectric constant than silicon oxide, or a combination thereof.

The channel structure CH passing through the gate stacking structure 120 and extending in a crossing direction (a Z-axis direction of the drawing) crossing (e.g., vertical to) the insulation portion 110*i* may be formed. The channel structure CH may have a column shape. For example, when viewed in a cross-section, the channel structure CH may have an inclined side such that a width becomes narrower as it approaches the insulation portion 110*i* according to an aspect ratio.

Each of the channel structures CH may form one memory cell string, and a plurality of channel structures CH may be spaced apart from each other and disposed while forming rows and columns in a plan view. For example, the plurality of channel structures CH on a plane may be disposed in any of various forms, e.g., a lattice form and a zigzag form.

The channel structure CH may include a channel layer 140 and a gate dielectric layer 150 located on the channel layer 140 between the gate electrode 130 and the channel layer 140. For example, the channel structure CH may further include a core insulation layer 142 located at an inside region (e.g., a central region) of the channel layer 140. In another example, the core insulation layer 142 may not be provided. The gate dielectric layer 150 located between the gate electrode 130 and the channel layer 140 may include a tunneling layer 152, a charge storage layer 154, and a blocking layer 156 sequentially formed on the channel layer 140. In an embodiment, the channel structure CH may include a doped channel layer 140*a* and/or a channel pad 144 connected to the channel layer 140.

The channel layer 140 may include a semiconductor material, e.g., polycrystalline silicon. The core insulation layer 142 may include any of various insulating materials. For example, the core insulation layer 142 may include silicon oxide, silicon nitride, silicon oxynitride, or a combination thereof. The tunneling layer 152 may include an insulating material capable of charge tunneling. For example, the tunneling layer 152 may include silicon oxide or silicon oxynitride. The charge storage layer 154 is used as a data storage region and may include polycrystalline silicon, silicon nitride, and the like. The blocking layer 156 may include an insulating material capable of preventing an undesirable charge inflow into the gate electrode 130. For example, the blocking layer 156 may include silicon oxide, silicon nitride, silicon oxynitride, or a high dielectric constant material having a higher dielectric constant than silicon oxide, or a combination thereof. In an embodiment, the blocking layer 156 may include a first blocking layer 156*a* including a portion extending horizontally along the gate electrode 130 and a second blocking layer 156*b* extending vertically between the first blocking layer 156*a* and the charge storage layer 154.

In an embodiment, the channel structure CH may include a protruded portion CHP protruding toward an outer surface of the insulation portion 110*i* (upward in FIG. 2), e.g., rather than toward the first surface 120*p* of the gate stacking structure 120. The protruded portion CHP is a portion provided with the doped channel layer 140*a* and/or the core insulation layer 142 without the gate dielectric layer 150. Since the gate dielectric layer 150 is not provided in the protruded portion CHP, the doped channel layer 140*a* may be exposed to an outside of the gate stacking structure 120 in the protruded portion CHP of the channel structure CH.

The doped channel layer 140*a* located at the protruded portion CHP may be a region formed by doping a portion of the channel layer 140 with a dopant. In further detail, the doped channel layer 140*a* may be formed by doping a dopant to a portion of the channel layer 140 exposed to the outside at the protruded portion CHP protruded from, e.g., above, the first surface 120*p* of the gate stacking structure 120. Accordingly, the doped channel layer 140*a* may be composed of a continuous layer connected to the channel layer 140. The doped channel layer 140*a* may include a semiconductor layer doped with a P-type or N-type dopant. For example, the doped channel layer 140*a* may be composed of a semiconductor layer (e.g., a polycrystalline silicon layer) doped with a dopant of the same conductivity type as a doped polycrystalline semiconductor layer 114. The current may flow stably through the doped channel layer 140*a* doped with the dopant.

For example, in the protruded portion CHP, a surface from which the gate dielectric layer 150 is removed may be located on the same plane as the first surface 120*p* of the gate stacking structure 120. This is because the gate dielectric layer 150 was removed with reference to the first surface 120*p* of the gate stacking structure 120 in a manufacturing process. Also, a boundary between the doped channel layer 140*a* and the channel layer 140 may be located on the same plane as the first surface 120*p* of the gate stacking structure 120, e.g., a boundary between the doped channel layer 140*a* and the channel layer 140 may be coplanar with the first surface 120*p* of the gate stacking structure 120. This is because the doped channel layer 140*a* is formed by diffusing a dopant to a portion of the channel layer 140 located at the protruded portion CHP from which the gate dielectric layer 150 is removed. The surface from which the gate dielectric layer 150 is removed and/or the boundary between the doped channel layer 140*a* and the channel layer 140 may be located higher or lower than the first surface 120*p* of the gate stacking structure 120.

For example, the channel pad 144 connected to the channel layer 140 at an upper portion of the channel structure CH (lower portion illustrated in FIG. 2) may be disposed to be connected to the channel layer 140 while being located on the core insulation layer 142. The channel pad 144 may include a conductive material, e.g., a polycrystalline silicon doped with an impurity.

In an embodiment, the gate stacking structure 120 may include a plurality of gate stacking structures 120*a* and 120*b* sequentially stacked on the insulation portion 110*i*, and the channel structure CH may include a plurality of channel structures CH1 and CH2 passing through the plurality of gate stacking structures 120*a* and 120*b*. Then, since a number of the stacked gate electrodes 130 may be increased, a number of the memory cells may be increased in a stable structure. In the drawing, two gate stacking structures 120 are illustrated, but the embodiment is not limited thereto, e.g., the gate stacking structure 120 may be composed of one gate stacking structure or may include three or more gate stacking structures.

A plurality of channel structures CH1 and CH2 constituting one channel structure CH may be connected to each other. The plurality of channel structures CH1 and CH2 may each have an inclined side surface such that a width becomes narrower closer to the insulation portion 110*i* according to an aspect ratio when viewed in a cross-section. Also, as shown in FIG. 2, a bent portion may be provided due to a difference in a width at a portion where the first channel structure CH1 and the second channel structure CH2 are connected. As another example, the plurality of channel structures CH1 and CH2 may have an inclined side surface continuously connected without the bent portion.

FIG. 2 illustrates that the gate dielectric layer 150, the channel layer 140, and the core insulation layer 142 of the plurality of channel structures CH1 and CH2 are extended within each other to have an integral structure. However, the embodiment is not limited thereto, and the gate dielectric layer 150, the channel layer 140, and the core insulation layer 142 of the plurality of channel structures CH1 and CH2 may be separately formed and electrically connected to each other. Also, a separate channel pad may be additionally provided at a connection portion of the plurality of channel structures CH1 and CH2.

In an embodiment, the gate stacking structure 120 may be partitioned in plural on a plane by a separation structure 146 extending in a direction (the Z-axis direction of the drawing) crossing (e.g., vertical to) the insulation portion 110*i* and penetrating the gate stacking structure 120. In addition, an upper separation region 148 may be formed at a portion adjacent to the circuit region 200 in the gate stacking structure 120. In a plane view, the separation structure 146 and/or the upper separation region 148 may extend (e.g., lengthwise) in a first direction (a Y-axis direction of the drawing). A plurality of separation structures 146 and/or a plurality of upper separation regions 148 may be spaced apart from each other with a predetermined interval in a second direction (an X-axis direction of the drawing) that crosses the first direction.

For example, the separation structure 146 may pass through the gate stacking structure 120 and extend up to the first surface 120*p*, and the upper separation region 148 may separate one or a part of the plurality of gate electrodes 130 from each other. The upper separation region 148 may be located between the separation structures 146.

As an example, the separation structure 146 is illustrated to have an inclined side surface whose width gradually decreases toward the first surface 120*p* of the gate stacking structure 120 or the insulation portion 110*i* due to a high aspect ratio when viewed in a cross-section. A side surface of the separation structure 146 may be vertical to the insulation portion 110*i* or may have a bent portion at a connection portion of the plurality of gate stacking structures 120*a* and 120*b*.

The separation structure 146 or the upper separation region 148 may be filled with any of various insulating materials. For example, the separation structure 146 or the upper separation region 148 may include an insulating material, e.g., silicon oxide, silicon nitride, or silicon oxynitride. As another example, the separation structure 146 may further include a semiconductor material, a metallic material, or the like. In this case, the separation structure 146 may include a spacer layer including an insulating material, and a portion formed on the spacer layer and including a semiconductor material, a metallic material, or the like.

In an embodiment, horizontal conductive layers 112 and 114 may be provided between the insulation portion 110*i* and the gate stacking structure 120 in the cell array region 102. In an embodiment, the horizontal conductive layers 112 and 114 may function as a common source line by being connected to the channel structure CH. For example, the horizontal conductive layers 112 and 114 may be connected (e.g., directly connected) to the doped channel layer 140*a* at a side surface of the protruded portion CHP of the channel structure CH. The horizontal conductive layers 112 and 114 may be electrically connected to a first contact portion 116 and/or a second contact portion 118.

The horizontal conductive layers 112 and 114 include a doped monocrystalline semiconductor layer 112 including a dopant. In this case, the doped monocrystalline semiconductor layer 112 may be spaced apart from the channel structure CH. The horizontal conductive layers 112 and 114 may further include a doped polycrystalline semiconductor layer 114 connecting the doped monocrystalline semiconductor layer 112 and the channel structure CH.

Here, the doped monocrystalline semiconductor layer 112 and/or the doped polycrystalline semiconductor layer 114 may include a P-type or N-type dopant. The P-type dopant may include a Group III element, and the N-type dopant may include a Group V element. For example, boron (B), aluminum (Al), indium (In), gallium (Ga), etc. may be used as the P-type dopant, and phosphorus (P), arsenic (As), antimony (Sb), etc. may be used as the N-type dopant, etc. Among them, when boron, phosphorus, or arsenic is used as the P-type or N-type dopant, carriers may be easily generated due to a low ionization energy.

The doped monocrystalline semiconductor layer 112 may include a doped monocrystalline silicon layer or a doped monocrystalline silicon-germanium layer formed by an epitaxial process. The horizontal conductive layers 112 and 114 may include the doped monocrystalline semiconductor layer 112, thereby reducing a leakage current and improving performance and reliability.

In this case, the doped monocrystalline semiconductor layer 112 may include a first conductivity type region 112*a* having a first conductivity type and a second conductivity type region 112*b* having a second conductivity type opposite to the first conductivity type. For example, the first conductivity type region 112*a* may be a region for an erase operation (e.g., a bulk-erase operation) of the semiconductor device 10, and the second conductivity type region 112*b* may be a region for a read operation of the semiconductor device 10. For example, the first conductivity type region 112*a* may be a P-type region having a P-type conductivity, and the second conductivity type region 112*b* may be an N-type region having an N-type conductivity.

A first contact portion 116 for applying a voltage for the erase operation may be electrically connected to the first conductivity type region 112*a*, and a second contact portion 118 for applying a voltage for the read operation may be electrically connected to the second conductivity type region 112*b*. The first contact portion 116 and the second contact portion 118 will be described in detail later.

In an embodiment, the first conductivity type region 112*a* may be a region having a first conductivity type dopant and, e.g., may not have a second conductivity type dopant. The second conductivity type region 112*b* may have both the first conductivity type dopant and the second conductivity type dopant, and a content and a doping concentration of the second conductivity type dopant may be higher than that of the first conductivity type dopant. That is, the second conductivity type region 112*b* includes the first conductivity type dopant, but the second conductivity type dopant is overdoped to be included at a higher concentration than the first conductivity type dopant.

The doped monocrystalline semiconductor layer 112 may include a connection portion 112*j* in which the second conductivity type region 112*b* is located as a part connected to the second contact portion 118, and a horizontal portion 112*h* where the first conductivity type region 112*a* is located at least at a part adjacent to (e.g., directly on) the first surface 120*p* of the gate stacking structure 120. For example, as illustrated in FIG. 2, the horizontal portion 112*h* may extend (e.g., lengthwise) on the first surface 120*p* of the gate stacking structure 120, e.g., the horizontal portion 112*h* may include portions on the first surface 120*p* that vertically overlap the interlayer insulating layer 132*m*, and the connection portion 112*j* may be between some horizontal portions 112*h* to vertically overlap the separation structure 146.

Here, a junction between the second conductivity type region 112*b* included in the connection portion 112*j* and the first conductivity type region 112*a* included in the horizontal portion 112*h* may constitute, e.g., define, a pn junction. In this way, when the doped monocrystalline semiconductor layer 112 is provided with the pn junction, it is possible to reduce a leakage current (a sub-threshold leakage current) caused by an off current, thereby improving performance and reliability of the semiconductor device 10.

For example, the connection portion 112*j* may be located adjacent to (e.g., directly on) the separation structure 146 at a portion where the separation structure 146 is located. For example, when viewed in a plan view, the connection portion 112*j* may overlap a portion where the separation structure 146 is formed, e.g., the connection portion 112*j* may vertically overlap a top of the separation structure 146. In further detail, when viewed in a plan view, the connection portion 112*j* may include an entire portion where the separation structure 146 is formed. This is because after forming an opening (a reference numeral 146*a* in FIG. 4B) for forming the separation structure 146, the second conductivity type region 112*b* constituting the connection portion 112*j* is formed by a local doping using the opening 146*a*. According to this, formation of the connection portion 112*j* may be performed as an easy process, and an additional space in which the second contact portion 118 is located is not needed by utilizing a space in which the separation structure 146 is formed.

The connection portion 112*j* may be a portion to which the second contact portion 118 is connected (e.g., directly connected), and may be a region provided for a read operation. For example, during the read operation, a depletion region (an inversed region) may be formed in the doped polycrystalline semiconductor layer 114, at least a portion (a portion adjacent to the first surface 120*p* of the gate stacking structure 120 and the channel structure CH) of the horizontal portion 112*h* of the doped monocrystalline semiconductor layer 112 and/or the doped channel layer 140*a*. During the read operation, electrons may flow through the depletion region and reach the connection portion 112*j*.

The horizontal portion 112*h* may be a portion to which the first contact portion 116 is connected (e.g., via the doped polycrystalline semiconductor layer 114), and may be a portion for performing the erase operation by a voltage applied from the first contact portion 116 during the erase operation. The horizontal portion 112*h* may be formed to have a large area by being located at (e.g., contacting) the first surface 120*p* of the gate stacking structure 120 as a whole except for a portion where the connection portion 112*j* is formed. Then, the erase operation may be stably performed.

The doped monocrystalline semiconductor layer 112 may include a first opening region 112*d*. At an inside portion of the first opening region 112*d*, the channel structure CH is located. This will be described in more detail later.

The doped polycrystalline semiconductor layer 114 may be located on the first surface 120*p* of the gate stacking structure 120 and the doped monocrystalline semiconductor layer 112. The doped polycrystalline semiconductor layer 114 may have a first conductivity type or a second conductivity type. For example, the doped polycrystalline semiconductor layer 114 may have a P-type conductivity or N-type conductivity. In an embodiment, the doped polycrystalline semiconductor layer 114 may be composed of a first doped polycrystalline semiconductor layer 114*a* having a first conductivity type or P-type conductivity, which will be described in detail later.

The insulation portion 110*i* may be formed on the channel structure CH, the doped monocrystalline semiconductor layer 112, and the doped polycrystalline semiconductor layer 114. The first contact portion 116 may penetrate the insulation portion 110*i*, and be electrically connected to the first conductivity type region 112*a* (e.g., via the doped polycrystalline semiconductor layer 114), and the second contact portion 118 may penetrate the insulation portion 110*i*, and may be electrically connected to the second conductivity type region 112*b*.

The first contact portion 116 and/or the second contact portion 118 may be made of any of various materials. For example, the first contact portion 116 and/or the second contact portion 118 may include barrier layers 116*b* and/or 118*b*, respectively, and metal layers 116*a* and/or 118*a*, respectively. The barrier layers 116*b* and/or 118*b* may include a conductive material (e.g., titanium (Ti), titanium nitride (TiN), etc.), and the metal layers 116*a* and/or 118*a* may include a metallic material (e.g., tungsten (W), copper (Cu), aluminum (Al), titanium (Ti) or an alloy including them).

A recess may be formed at a portion of the doped monocrystalline semiconductor layer 112 and/or the doped polycrystalline semiconductor layer 114 where the first contact portion 116 and/or the second contact portion 118 is in contact. For example, although not shown in the drawing, a silicide layer may be formed at a portion of the doped monocrystalline semiconductor layer 112 and/or the doped polycrystalline semiconductor layer 114 where the first contact portion 116 and/or the second contact portion 118 is in contact. For example, a silicide layer including titanium silicide (TiSi) or the like may be formed.

As described above, the depletion region may be formed in the doped monocrystalline semiconductor layer 112, the doped polycrystalline semiconductor layer 114, and/or the doped channel layer 140*a* during the read operation. As an example, the doped polycrystalline semiconductor layer 114 is formed, e.g., conformally, to cover the first surface 120*p* of the gate stacking structure 120, the protruded portion CHP of the channel structure CH, and the doped monocrystalline semiconductor layer 112. Accordingly, an outer surface (an upper surface in FIG. 2) of the doped polycrystalline semiconductor layer 114 may be located higher than an outer surface (an upper surface in FIG. 2) of the doped monocrystalline semiconductor layer 112, e.g., relative to the first substrate 210. Accordingly, when the doped monocrystalline semiconductor layer 112 has a thickness at which the depletion region may be stably formed, the depletion region may also be stably formed in the doped polycrystalline semiconductor layer 114.

For example, a thickness of the doped monocrystalline semiconductor layer 112 may be 10 nm to 1 μm or less. When the thickness of the doped monocrystalline semiconductor layer 112 is 10 nm or more, the depletion region may be stably formed. If the thickness of the doped monocrystalline semiconductor layer 112 exceeds 1 μm, a process time may increase and a process cost may increase.

For example, the thickness of the doped monocrystalline semiconductor layer 112 may be greater than a thickness of the interlayer insulating layer 132*m* (i.e., a cell insulation layer 132) located between two adjacent gate electrodes 130, and the thickness of the doped monocrystalline semiconductor layer 112 may be greater than a thickness of the gate electrode 130. According to this, the depletion region may be stably formed in the doped monocrystalline semiconductor layer 112 and/or the doped polycrystalline semiconductor layer 114 during the read operation. In another example, the thickness of the doped monocrystalline semiconductor layer 112 may be equal to or smaller than the thickness of the interlayer insulating layer 132*m* and/or the gate electrode 130.

For example, the thickness of the doped monocrystalline semiconductor layer 112 may be greater than a thickness of the doped channel layer 140*a*, and the thickness of the doped monocrystalline semiconductor layer 112 may be greater than a thickness of the doped polycrystalline semiconductor layer 114. According to this, the depletion region may be stably formed in the doped monocrystalline semiconductor layer 112 and/or the doped polycrystalline semiconductor layer 114 during the read operation. However, an embodiment is not limited thereto. In another example, the thickness of the doped monocrystalline semiconductor layer 112 may be equal to or smaller than the thickness of the doped channel layer 140*a* and/or the thickness of the doped polycrystalline semiconductor layer 114.

For example, the thickness of the doped polycrystalline semiconductor layer 114 may be greater than the thickness of the doped channel layer 140*a*. According to this, the current may stably flow through the doped polycrystalline semiconductor layer 114, and the bending caused by the protruded portion CHP of the channel structure CH may be stably covered. Also, when the first contact portion 116 is connected to the doped polycrystalline semiconductor layer 114, a connection property with the first contact portion 116 may be improved. In another example, the thickness of the doped polycrystalline semiconductor layer 114 may be equal to or smaller than the thickness of the doped channel layer 140*a*.

For example, a doping concentration of the doped polycrystalline semiconductor layer 114 may be greater than a doping concentration of the doped channel layer 140*a*, and may be greater than a doping concentration of a region having the same conductivity type in the doped monocrystalline semiconductor layer 112. In another example, the doping concentration of the doped polycrystalline semiconductor layer 114 may be equal to or smaller than the doping concentration of the doped channel layer 140*a* and/or the doping concentration of the region having the same conductivity type in the doped monocrystalline semiconductor layer 112.

As mentioned above, in the embodiment, the doped polycrystalline semiconductor layer 114 may be composed of a first doped polycrystalline semiconductor layer 114*a* having a first conductivity type (e.g., a P-type conductivity). In this case, the doped channel layer 140*a* provided at the protruded portion CHP of the channel structure CH may have the same first conductivity type (e.g., the P-type conductivity) as the first doped polycrystalline semiconductor layer 114*a*.

In the doped monocrystalline semiconductor layer 112, the connection portion 112*j* may include, e.g., consist of, the second conductivity type region 112*b* and the horizontal portion 112*h* may include, e.g., consist of, the first conductivity type region 112*a*. That is, in the connection portion 112*j* of the doped monocrystalline semiconductor layer 112, the second conductivity type region 112*b* may be located as a whole in a thickness direction, e.g., the second conductivity type region 112*b* may fill completely the connection portion 112*j* in the thickness direction. In the horizontal portion 112*h* of the doped monocrystalline semiconductor layer 112, the first conductivity type region 112*a* may be located as a whole in the thickness direction, e.g., the first conductivity type region 112*a* may fill completely the horizontal portion 112*h* in the thickness direction. Accordingly, the first doped polycrystalline semiconductor layer 114*a* may be located adjacent to (e.g., in direct contact with) the first conductivity type region 112*a* at the horizontal portion 112*h* of the doped monocrystalline semiconductor layer 112.

For example, a doping concentration of the first conductivity type dopant may be higher at a surface of the horizontal portion 112*h* than on an inside of the horizontal portion 112*h*. This is because the first conductivity type dopant was additionally doped to the surface of the horizontal portion 112*h* in a process of forming the doped channel layer 140*a*. However, the embodiment is not limited thereto, e.g., a doping profile of the connection portion 112*j* and/or the horizontal portion 112*h* may be variously modified.

In an embodiment, at least two of the first doped polycrystalline semiconductor layer 114*a*, the doped channel layer 140*a*, and the first conductivity type region 112*a* having the same first conductivity type dopant have the same material or element as the first conductivity type dopant. For example, at least two first conductivity type dopants among the first doped polycrystalline semiconductor layer 114*a*, the doped channel layer 140*a*, and the first conductivity type region 112*a* may be the same material or element.

In another embodiment, at least two of the first doped polycrystalline semiconductor layer 114*a*, the doped channel layer 140*a*, and the first conductivity type region 112*a* may have different materials or elements as the first conductivity type dopant. Alternatively, the first conductivity type dopant included in the horizontal portion 112*h* constituting the first conductivity type region 112*a* may include a plurality of materials or a plurality of elements. For example, a surface of the horizontal portion 112*h* may include a first conductivity type dopant of a material or element different from a first conductivity type dopant included in an inside of the horizontal portion 112*h*. This is the reason that at least two of the first conductivity type dopant used for doping the first doped polycrystalline semiconductor layer 114*a*, the first conductivity type dopant used for doping the doped channel layer 140*a*, and the first conductivity type dopant used for doping the first doped monocrystalline semiconductor layer (reference numeral 112*p* in FIG. 4A) may be different.

Figure 3:
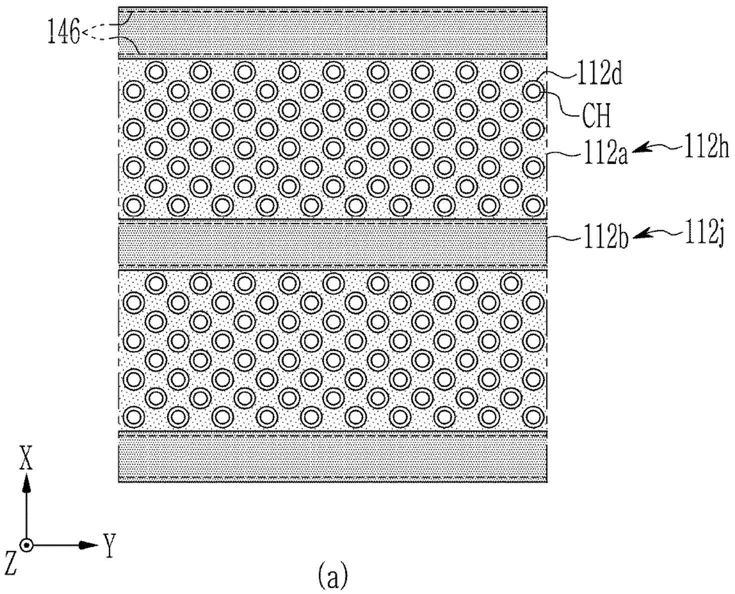
FIG. 3 is a partial top plan view of a cell array region of the semiconductor device in FIG. 1.
Figure 3:
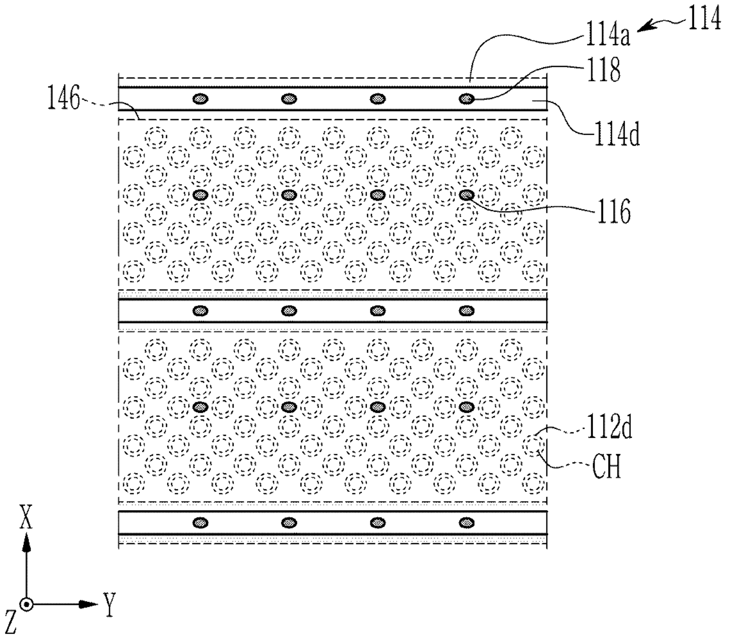

Hereinafter, a plane shape, a plane arrangement, etc. of the doped monocrystalline semiconductor layer 112, the first doped polycrystalline semiconductor layer 114*a*, the first contact portion 116, and the second contact portion 118 will be explained in more detail with reference to FIG. 3 along with FIG. 1 and FIG. 2. FIG. 3 is a partial top plan view showing the cell array region 102 of the semiconductor device 10 included in FIG. 1. Part (a) of FIG. 3 shows a plane on which the doped monocrystalline semiconductor layer 112 is located as a reference, and part (b) of FIG. 3 shows a plane on which the doped polycrystalline semiconductor layer 114 is located and shows positions of the first contact portion 116 and the second contact portion 118.

Referring to part (a) of FIG. 3, in a plan view, the doped monocrystalline semiconductor layer 112 may be entirely formed except for the first opening region 112*d* where the channel structure CH is located therein. That is, the doped monocrystalline semiconductor layer 112 may be composed of a single portion formed in a horizontal direction as a whole except for a plurality of first opening regions 112*d* in which a plurality of channel structures CH (e.g., a plurality of protruded portions CHP) are respectively located therein. Here, the first opening region 112*d* may have an area larger than that of the protruded portion CHP of the channel structure CH, and may be entirely spaced apart from an outer surface of the protruded portion CHP of the channel structure CH with a predetermined interval. For example, as illustrated in part (a) of FIG. 3, the first opening region 112*d* may have a circular shape, but a shape of the first opening region 112*d* may be variously modified, e.g., an elliptical shape, a polygonal shape, an irregular shape, or the like.

At this time, the connection portion 112*j* composed of the second conductivity type region 112*b* may be located at a region corresponding to the separation structure 146 or a region including the separation structure 146, and the horizontal portion 112*h* composed of the first conductivity type region 112*a* may be located at a region other than the connection portion 112*j*. The connection portion 112*j*, like the separation structure 146, may be extended (e.g., lengthwise) along the first direction (the Y-axis direction of the drawing), and may be provided in plurality so as to be spaced apart from each other with a predetermined interval in the second direction (the X-axis direction of the drawing). In addition, the horizontal portion 112*h* may be entirely formed at a portion between two connection portions 112*j* adjacent to each other except for the plurality of first opening regions 112*d*. Accordingly, at portions adjacent to both edges of the separation structure 146 extending in the first direction (the Y-axis direction of the drawing), a pn junction may extend along the first direction.

Referring to FIG. 2 and part (b) of FIG. 3, the first doped polycrystalline semiconductor layer 114*a* may include a connection portion 1142. The connection portion 1142 may be located within at least the first opening region 112*d*. The connection portion 1142 may connect a side surface of the channel structure CH (e.g., the doped channel layer 140*a* of the protruded portion CHP) and a side surface of the doped monocrystalline semiconductor layer 112, which are spaced apart from each other at the first surface 120*p* of the gate stacking structure 120 in a horizontal direction. In further detail, the connection portion 1142 may be located on (e.g., in direct contact with) the first surface 120*p* of the gate stacking structure 120 while filling inside the first opening region 112*d* formed by a removal of the gate dielectric layer 150 at the protruded portion CHP. For example, the connection portion 1142 may be in contact with the side surface of the doped channel layer 140*a* and the side surface of the doped monocrystalline semiconductor layer 112 in the first opening region 112*d*.

Also, the first doped polycrystalline semiconductor layer 114*a* may further include a protruded portion 1144 and a horizontal portion 1146. The protruded portion 1144 may be located on (e.g., in direct contact with) a side surface and a bottom surfaces (an upper surface of FIG. 6) of the protruded portion CHP to cover the protruded portion CHP of the channel structure CH, and may be protruded toward an outer surface (an upper surface of FIG. 6) of the insulation portion 110*i*. The horizontal portion 1146 may be located on (e.g., in direct contact with) the doped monocrystalline semiconductor layer 112.

At this time, the first doped polycrystalline semiconductor layer 114*a* may be located to be connected to (e.g., in direct contact with) the first conductivity type region 112*a* or the horizontal portion 112*h*, and the doped channel layer 140*a*. The first doped polycrystalline semiconductor layer 114*a* may be spaced apart from the second conductivity type region 112*b* or the connection portion 112*j*.

For example, the first doped polycrystalline semiconductor layer 114*a* may be entirely formed at a portion except for a second opening region 114*d* in which the second contact portion 118 is located therein. Accordingly, the first doped polycrystalline semiconductor layer 114*a* may be formed of a single portion entirely formed between two second opening regions 114*d* or two separation structures 146 adjacent to each other. In another example, the first doped polycrystalline semiconductor layer 114*a* or the doped polycrystalline semiconductor layer 114 may include a plurality of portions spaced apart from each other between two second opening regions 114*d* or two separation structures 146 adjacent to each other. This is described in detail with reference to FIG. 9.

For example, as illustrated in FIG. 3, the second opening region 114*d* has a straight-line shape extending in the first direction (the Y-axis direction of the drawing) along the separation structure 146 or the connection portion 112*j*, and a plurality of second contact portion 118 are located in one second opening region 114*d*. Accordingly, a patterning process for forming the second opening region 114*d* may be easily performed. In another example, the second opening region 114*d* may be provided to correspond to each second contact portion 118, and numerous other variations are possible.

In an embodiment, the first contact portion 116 may be connected (e.g., directly connected) to the first doped polycrystalline semiconductor layer 114*a* and electrically connected to the first conductivity type region 112*a* or the horizontal portion 112*h*. Accordingly, a connection structure of the first contact portion 116 may be simplified, and a separate space for the first contact portion 116 to be located is not needed, which is advantageous in terms of space. The second contact portion 118 may be connected (e.g., directly connected) to the second conductivity type region 112*b* provided in the connection portion 112*j* of the doped monocrystalline semiconductor layer 112.

For example, as illustrated in FIG. 1 and FIG. 2, the first contact portion 116 may be located on (e.g., in direct contact with) the horizontal portion 1146 and the protruded portion 1144 of the first doped polycrystalline semiconductor layer 114*a* between the plurality of protruded portions CHP included in the plurality of channel structures CH. That is, it is exemplified that the first contact portion 116 is formed to fill a space located between the first doped polycrystalline semiconductor layers 114*a* covering the plurality of protruded portions CHP included in the plurality of channel structures CH. Accordingly, an electric property may be improved by increasing a contact area of the first contact portion 116 and the first doped polycrystalline semiconductor layer 114*a*. In another example, the first contact portion 116 may be provided on the protruded portion 1144, and numerous other variations are possible.

For example, as illustrated in FIG. 3, the first contact portion 116 and/or the second contact portion 118 may have an elliptical shape with a major axis in the first direction (the Y-axis direction of the drawing) and a minor axis in the second direction (the X-axis direction of the drawing). Accordingly, a patterning process may be easily performed, and a connection area between the first contact portion 116 and the first doped polycrystalline semiconductor layer 114*a* and/or a connection area between the second contact portion 118 and the second conductivity type region 112*b* may be sufficiently secured. In another example, the first contact portion 116 and/or the second contact portion 118 may have different configurations of axes and any suitable shape, e.g., circular, polygonal, linear, irregular shape, or the like.

Referring to FIG. 1 again, the connection region 104 and the second wire portion 180 may be provided to connect the gate stacking structure 120 and/or the channel structure CH provided in the cell array region 102 to the circuit region 200 or an external circuit. Further, a second bonding structure 192 and a second insulation layer 190 may be provided on a surface of the second wire portion 180 facing the circuit region 200.

Here, the second wire portion 180 may include all members electrically connecting the gate electrode 130, the channel structure CH, or the like to the circuit region 200 or the external circuit. For example, the second wire portion 180 may include a bitline 182, a gate contact portion 184, an input/output pad 198, an input/output connection wire 188, and contact vias 180*a* respectively connected thereto. According to an embodiment, a connection wire 190*a* connected to the bitline 182, the gate contact portion 184, and/or the input/output connection wire 188 may be further included.

The bitline 182 may be located on the cell insulation layer 132 of the gate stacking structure 120 formed in the cell array region 102. The bitline 182 may extend in the second direction (the X-axis direction of the drawing) crossing the first direction (the Y-axis direction of the drawing) in which the gate electrode 130 extends. The bitline 182 may be electrically connected to the channel structure CH, e.g., to the channel pad 144, through the contact via 180*a*, e.g., a bitline contact via.

The connection region 104 may be disposed at a periphery of the cell array region 102, and a part of the second wire portion 180 may be located at the connection region 104. The connection region 104 may include a member for connecting the gate electrode 130 and the circuit region 200. In an embodiment, the gate electrodes 130 and the interlayer insulating layers 132*m* of the plurality of gate stacking structure 120 may be located in the connection region 104 and extended in the first direction (the Y-axis direction of the drawing). For example, in a direction away from the cell array region 102, the plurality of gate electrodes 130 may have a stair shape in which lengths of the plurality of gate electrodes 130 sequentially increase toward the insulation portion 110*i*. In this case, the plurality of gate electrodes 130 may have a stair shape in one direction or a plurality of directions.

In the drawing, it is exemplified that the gate contact portion 184 is located between the gate electrode 130 and the connection wire 190*a* to connect the gate electrode 130 and the connection wire 190*a*. However, the embodiment is not limited thereto, e.g., the gate contact portion 184 may be formed to pass through the plurality of gate electrodes 130. At this time, the gate contact portion 184 may be electrically connected to one connection gate electrode and may be spaced apart from the other gate electrodes by an insulation pattern.

In addition, the input/output pad 198 and the input/output connection wire 188 may be located in the connection region 104. For example, the input/output connection wire 188 may be connected to the input/output pad 198 and at least one of the second bonding structure 192. For example, the input/output pad 198 may be located on an outer surface of the insulation portion 110*i*. According to an embodiment, a separate input/output pad electrically connected to the circuit region 200 may be provided.

In FIG. 1, when viewed in a cross-section, it is illustrated that the gate contact portion 184 has an inclined side so that a width narrows as it approaches the insulation portion 110*i*, and the input/output connection wire 188 has an inclined side so that a width widens as it approaches the insulation portion 110*i*. However, the embodiment is not limited thereto, e.g., the gate contact portion 184 and/or the input/output connection wire 188 may have a vertical side with a constant width. For example, as illustrated in FIG. 1, the gate contact portion 184 may include a bent portion at a boundary between the plurality of gate stacking structures 120*a* and 120*b*. In another example, the gate contact portion 184 may not have the bent portion at the boundary between the plurality of gate stacking structures 120*a* and 120*b*.

One surface of the circuit region 200 adjacent to the cell region 100 is a junction surface or a bonding surface with the cell region 100, and is composed of a first bonding structure 240 and a first insulation layer 250 located at a periphery of the first bonding structure 240. One surface of the cell region 100 adjacent to the circuit region 200 is a junction surface or a bonding surface with the circuit region 200, and is composed of a second bonding structure 192 and a second insulation layer 190 located at a periphery of the second bonding structure 192. The first bonding structure 240 may be located on the first wire portion 230 and be electrically connected to the first wire portion 230. The second bonding structure 192 may be located on the second wire portion 180 and be electrically connected to the second wire portion 180.

One surface of the cell region 100 and one surface of the circuit region 200 may be bonded by a hybrid bonding. In further detail, the first bonding structure 240 of the circuit region 200 and the second bonding structure 192 of the cell region 100 may be bonded to a directly contacted state, thereby forming a metal bonding. Also, at peripheries of the first bonding structure 240 and the second bonding structure 192, the first insulation layer 250 located on one surface of the circuit region 200 and the second insulation layer 190 located on the one surface of the cell region 100 are bonded in direct contact, thereby forming an insulation-layer bonding.

For example, the first bonding structure 240 and/or the second bonding structure 192 may be made of copper, aluminum, tungsten, nickel, gold, tin, manganese, cobalt, titanium, tantalum, ruthenium or an alloy including these. For example, the first bonding structure 240 and/or the second bonding structure 192 includes copper at least at the bonding surface, so that the metal bonding of the circuit region 200 and the cell region 100 may be configured of a copper-to-copper bonding. In an embodiment, the first insulation layer 250 and the second insulation layer 190 may include the same insulating material on the bonding surface. For example, the first insulation layer 250 and/or the second insulation layer 190 may have a layer including silicon carbonitride on at least the bonding surface. However, the embodiment is not limited to the materials of the first bonding structure 240, the second bonding structure 192, the first insulation layer 250, and the second insulation layer 190.

In this way, the first bonding structure 240 of the circuit region 200 and the second bonding structure 192 of the cell region 100 may be bonded to provide an electrical connection path between the circuit region 200 and the cell region 100. For example, the bitline 182 connected to the channel structure CH and the gate electrode 130 may be electrically connected to the circuit element 220 of the circuit region 200 by the second wire portion 180 and the first wire portion 230.

According to an embodiment, the horizontal conductive layers 112 and 114 may include the doped monocrystalline semiconductor layer 112 to reduce a leakage current, thereby improving performance and reliability of the semiconductor device 10. The horizontal conductive layers 112 and 114 or the doped monocrystalline semiconductor layer 112 may include the first conductivity type region 112*a* and the second conductivity type region 112*b*. Thus, a bulk erase operation may be performed by using the first conductivity type region 112*a*, and a read operation may be performed by using the second conductivity type region 112*b*. As described above, according to the bulk erase operation, a stable erase operation may be performed regardless of a number of the gate electrodes 130 or a number of the memory cells.

An example of a manufacturing method of the above semiconductor device 10 will be explained in detail with reference to FIG. 4A to FIG. 4I along with FIG. 1 to FIG. 3. Detailed descriptions for portions that have already been explained will be omitted, and descriptions for portions that have not been explained will be given in detail.

FIG. 4A to FIG. 4I are partial cross-sectional views showing stages in a manufacturing method of a semiconductor device according to an embodiment. FIG. 4A to FIG. 4I show a part of the cell array region 102. Hereinafter, the manufacturing method of the semiconductor device 10 will be mainly explained based on the horizontal conductive layers 112 and 114, the gate stacking structure 120, the channel structure CH, and the separation structure 146, which are formed in the cell region 100.

Figure 4A:
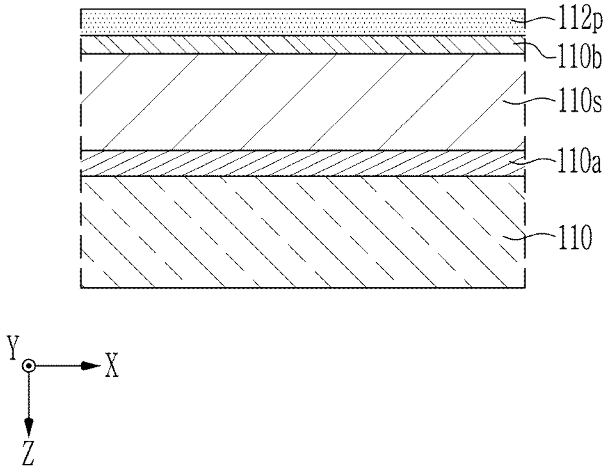
FIG. 4A to FIG. 4I are partial cross-sectional views of stages in a manufacturing method of a semiconductor device according to an embodiment.

As shown in FIG. 4A, a first doped monocrystalline semiconductor layer 112*p* may be formed on a semiconductor substrate 110. For example, a first etch-stopping layer 110*a*, a semiconductor layer 110*s*, a second etch-stopping layer 110*b*, and the first doped monocrystalline semiconductor layer 112*p* may be sequentially formed on the semiconductor substrate 110. Here, the semiconductor substrate 110, the first etch-stopping layer 110*a*, the semiconductor layer 110*s*, and the second etch-stopping layer 110*b* may be referred to as a second substrate.

The semiconductor substrate 110 may be a semiconductor substrate including a semiconductor material. For example, the semiconductor substrate 110 may be a semiconductor substrate made of a semiconductor material, or may be a semiconductor substrate in which a semiconductor layer is formed on a base substrate. For example, the semiconductor substrate 110 may include a monocrystalline semiconductor substrate or a monocrystalline semiconductor layer. Then, a monocrystalline semiconductor layer may be easily formed on the semiconductor substrate 110 by using an epitaxial process. For example, the semiconductor substrate 110 may be composed of monocrystalline silicon, monocrystalline silicon-germanium, silicon-on-insulator, or germanium-on-insulator.

The first etch-stopping layer 110*a*, the semiconductor layer 110*s*, the second etch-stopping layer 110*b*, and the first doped monocrystalline semiconductor layer 112*p* may be a monocrystalline semiconductor layer or an epitaxial semiconductor layer formed by an epitaxial process. Here, the first etch-stopping layer 110*a*, the semiconductor layer 110*s*, the second etch-stopping layer 110*b*, and the first doped monocrystalline semiconductor layer 112*p* may include a common material or element, but the first and second etch-stopping layers 110*a* and 110*b* may be formed of a different material from the semiconductor substrate 110 and the semiconductor layer 110*s*.

For example, the first etch-stopping layer 110*a*, the semiconductor layer 110*s*, the second etch-stopping layer 110*b*, and the first doped monocrystalline semiconductor layer 112*p* may include a common material or element and then may be formed sequentially by an in-situ process that changes a gas used in the epitaxial process. Accordingly, a formation process may be simplified. As another example, at least a part of the first etch-stopping layer 110*a*, semiconductor layer 110*s*, the second etch-stopping layer 110*b*, and the first doped monocrystalline semiconductor layer 112*p* may be formed by a separate process.

The first and second etch-stopping layers 110*a* and 110*b* may include materials different from those of the semiconductor substrate 110 and the semiconductor layer 110*s* and have different etch selectivities with respect to the semiconductor substrate 110 and the semiconductor layer 110*s* for a selective etching. Accordingly, in a process of removing the semiconductor substrate 110 and the semiconductor layer 110*s* by using the first and second etch-stopping layers 110*a* and 110*b* in a subsequent process, a channel structure (i.e., CH in FIG. 4B) may be protected. For example, the first etch-stopping layer 110*a* and/or the second etch-stopping layer 110*b* may include silicon-germanium, and the semiconductor substrate 110, the semiconductor layer 110*s*, and the first doped monocrystalline semiconductor layer 112*p* may include silicon.

The first doped monocrystalline semiconductor layer 112*p* may include a first conductivity type dopant (e.g., a P-type dopant). For example, in the process of forming the first doped monocrystalline semiconductor layer 112*p*, the first conductivity type dopant may be included in the first doped monocrystalline semiconductor layer 112*p*. As another example, after forming an undoped monocrystalline semiconductor layer, the first doped monocrystalline semiconductor layer 112*p* may be formed by doping the undoped monocrystalline semiconductor layer with a first conductivity type dopant.

On the other hand, the semiconductor substrate 110, the first and second etch-stopping layers 110*a* and 110*b*, and the semiconductor layer 110*s* may be an undoped monocrystalline semiconductor layer or an intrinsic monocrystalline semiconductor layer that does not include a dopant.

FIG. 4A shows that a thickness of the semiconductor layer 110*s* is greater than a thickness of the first and/or second etch-stopping layers 110*a* and 110*b* as an example. Then, an end portion of the channel structure CH may be stably located within the semiconductor layer 110*s*. However, the embodiment is not limited thereto, e.g., the thickness of the semiconductor layer 110*s* may be equal to or smaller than the thickness of the first and/or the second etch-stopping layers 110*a*, and 110*b*.

Figure 4B:
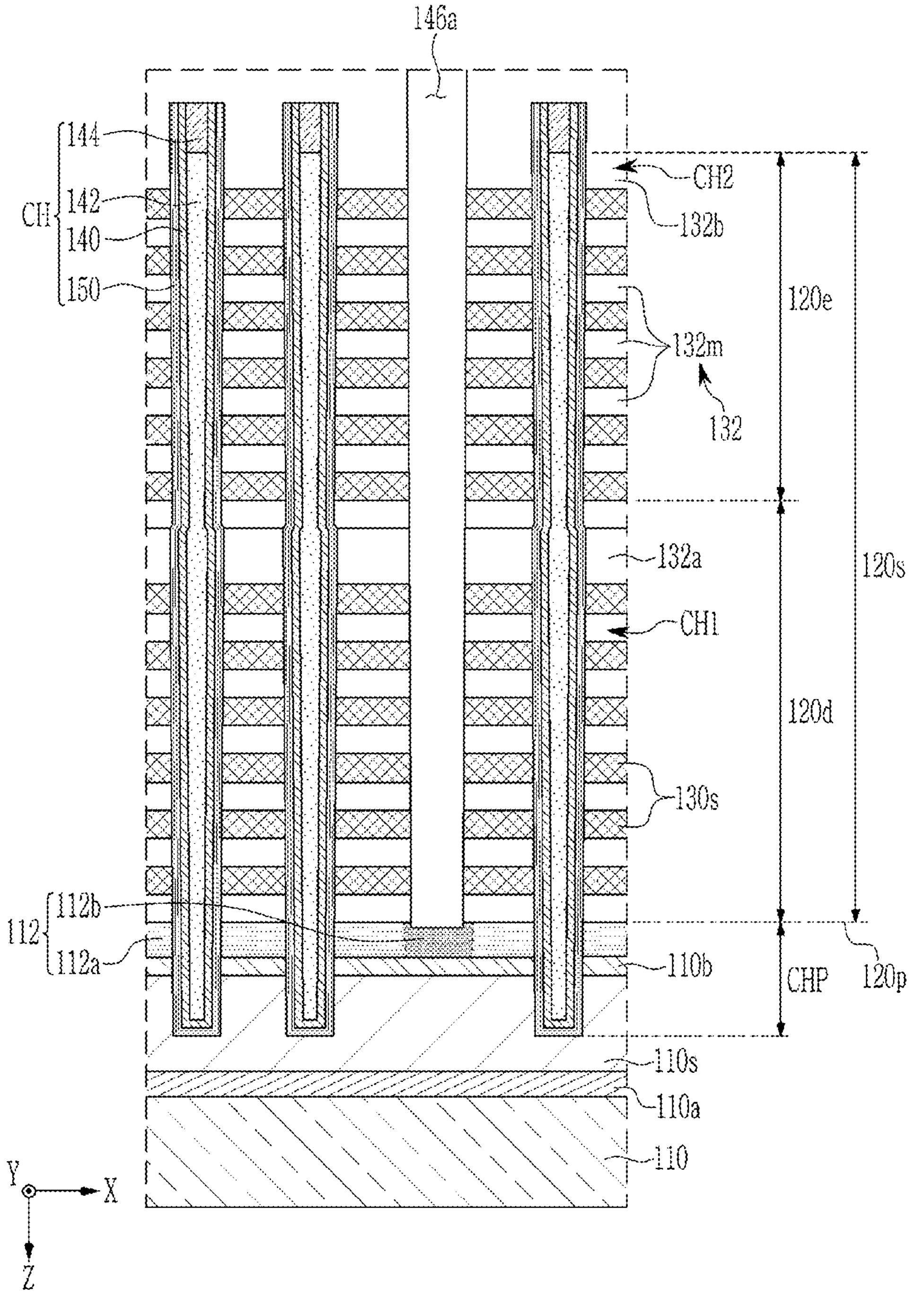

Subsequently, as shown in FIG. 4B, a stacking structure 120*s* may be formed on the first doped monocrystalline semiconductor layer (i.e., on the first doped monocrystalline semiconductor layer 112*p* of FIG. 4A), and the channel structure CH penetrating the stacking structure 120*s* and the first doped monocrystalline semiconductor layer 112*p* and an opening 146*a* penetrating the stacking structure 120*s* to expose a part of the first doped monocrystalline semiconductor layer 112*p* may be formed. The second conductivity type region 112*b* may be formed by doping a second conductivity type dopant to a part of the first doped monocrystalline semiconductor layer 112*p* exposed through the opening 146*a*. Accordingly, the doped monocrystalline semiconductor layer 112 including the first conductivity type region 112*a* and the second conductivity type region 112*b* may be formed.

First, the stacking structure 120*s* may be formed by alternately stacking a plurality of sacrificial insulation layer 130*s* and a plurality of cell insulation layers 132 on the first doped monocrystalline semiconductor layer 112*p*. The cell insulation layer 132 may include the interlayer insulating layer 132*m*, upper insulation layers 132*a* and 132*b*, and the like. Here, the sacrificial insulation layer 130*s* may be a layer that will be replaced with a gate electrode (i.e., the gate electrode 130 of FIG. 4C) through a subsequent process. Accordingly, the sacrificial insulation layer 130*s* may be formed to correspond to a portion where the gate electrode 130 is to be formed.

The sacrificial insulation layer 130*s* may be formed of a material different from that of the cell insulation layer 132. For example, the cell insulation layer 132 may include silicon oxide, silicon nitride, silicon oxynitride, low dielectric constant material, or the like. The sacrificial insulation layer 130*s* may include silicon, silicon oxide, silicon carbide, silicon nitride, or the like, and may be made of a different material from the cell insulation layer 132.

Subsequently, a penetrating portion penetrating the stacking structure 120*s* may be formed to correspond to a portion where the channel structure CH is to be formed, and the channel structure CH may be formed in the penetrating portion. That is, the channel structure CH may be formed by sequentially forming the gate dielectric layer 150, the channel layer 140, and the core insulation layer 142 to fill the penetrating portion, and forming the channel pad 144 connected to the channel layer 140. At this time, a first blocking layer (reference numeral 156*a* of FIG. 2) among the gate dielectric layer 150 may not be formed and may be formed later in another process.

In an embodiment, the stacking structure 120*s* may include a plurality of stacking structures 120*d* and 120*e* alternately stacked on the first doped monocrystalline semiconductor layer 112*p*, and the channel structure CH may include a plurality of the channel structures CH1 and CH2 penetrating the plurality of stacking structures 120*d* and 120*e*.

At this time, the penetrating portion and the channel structure CH may be formed so that an end of the channel structure CH may be located within the semiconductor layer 110*s*. Correspondingly, the channel structure CH may stably penetrate the first doped monocrystalline semiconductor layer 112*p*. Then, horizontal conductive layers (112 and 114 in FIG. 4I) may be stably located on a side surface of the channel structure CH. That is, a process margin may be secured. A portion of the channel structure CH protruded from the first surface 120*p* of the stacking structure 120*s* may be a portion constituting the protruded portion CHP of the channel structure CH.

According to an embodiment, the upper separation region (i.e., the upper separation region 148 in FIG. 1) may be formed at a part of the second stacking structure 120*e*. The upper separation region 148 may be formed by forming an upper separation opening by an etching process using a mask layer and depositing an insulating material into the upper separation opening. In addition, an order of a formation of the upper separation region 148 may be different, e.g., the upper separation region 148 may be formed after formation of the separation structure 146.

An opening 146*a* exposing a part of the first doped monocrystalline semiconductor layer 112*p* may be formed through the stacking structure 120*s*. The opening 146*a* may be formed to correspond to a portion where the separation structure 146 is to be formed. For example, the opening 146*a* may be formed after a cell insulation layer 132 is additionally formed to cover the channel structure CH and the upper separation region 148.

Subsequently, a second conductivity type dopant (e.g., an N-type dopant) may be doped to the part of the doped monocrystalline semiconductor layer 112 exposed through the opening 146*a* to form the second conductivity type region 112*b*. The other part of the first doped monocrystalline semiconductor layer 112*p* in which the second conductivity type region 112*b* is not formed may remain to form the first conductivity type region 112*a*. Accordingly, the doped monocrystalline semiconductor layer 112 including the first conductivity type region 112*a* and the second conductivity type region 112*b* may be formed.

At this time, an ion implant process may be used as a process of doping a part of the first doped monocrystalline semiconductor layer 112*p* with the second conductivity type dopant. Then, the second conductivity type dopant may be locally or partially doped to the part of the first doped monocrystalline semiconductor layer 112*p* exposed by the opening 146*a*. In this case, the second conductivity type region 112*b* may be formed by doping the second conductivity type dopant in a larger amount than the first conductivity type dopant included in the first doped monocrystalline semiconductor layer 112*p*, i.e., by over-doping.

In the embodiment, the second conductivity type region 112*b* constituting the connection portion 112*j* (FIG. 4I) may be easily formed by using the opening 146*a* for forming the separation structure 146. In addition, a space for forming the connection portion 112*j* and the second contact portion 118 (FIG. 4I) connected thereto is not separately added.

Figure 4C:
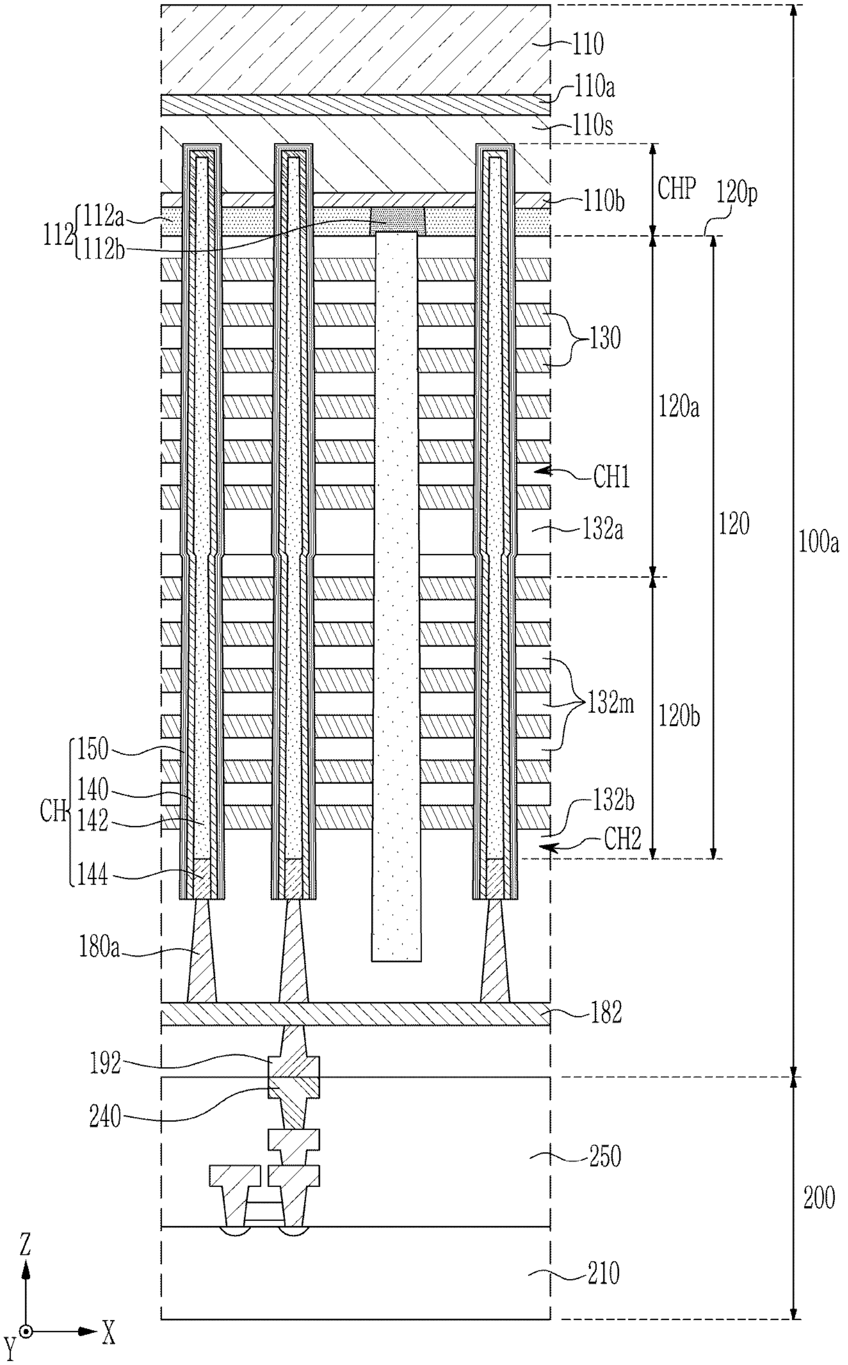

Next, as shown in FIG. 4C, a preliminary cell region 100*a* may be formed. That is, the plurality of sacrificial insulation layers 130*s* (FIG. 4B) may be replaced by a plurality of gate electrodes 130, and the separation structure 146, the second wire portion 180, the second bonding structure 192, the second insulation layer 190, and the like may be additionally formed. And then, the preliminary cell region 100*a* may be bonded to the circuit region 200.

In further detail, the sacrificial insulation layers 130*s* may be selectively removed by an etching process (e.g., a dry etching process) through the opening 146*a* (FIG. 4B). In addition, the gate electrodes 130 may be formed by filling a conductive material constituting the gate electrodes 130 at portions from which the sacrificial insulation layers 130*s* are removed. Then, the gate stacking structure 120 including the plurality of gate stacking structures 120*a* and 120*b* may be formed by replacing portions where the sacrificial insulation layers 130*s* are located with the gate electrodes 130. At this time, a process of forming the first blocking layer 156*a* (FIG. 2) may be further performed before the process of filling the conductive material constituting the gate electrode 130.

Subsequently, an insulating material, a semiconductor material, a metallic material, or the like may be filled in the opening 146*a* to form the separation structure 146. In addition, the second wire portion 180, the second bonding structure 192, the second insulation layer 190, and the like may be formed to form the preliminary cell region 100*a*. The preliminary cell region 100*a* may refer to a cell region before the horizontal conductive layers 112 and 114 and first and second contact portions 116 and 118 are formed.

Then, the preliminary cell region 100*a* may be bonded to the circuit region 200. For example, an upper surface (a bottom surface of FIG. 4C) of the preliminary cell region 100*a* may be bonded to the circuit region 200.

In a bonding process between the circuit region 200 and the preliminary cell region 100*a*, the preliminary cell region 100*a* may be bonded in an upside-down state (or an inverted state) to the circuit region 200. The circuit region 200 and the preliminary cell region 100*a* may be bonded by a hybrid bonding. The hybrid bonding may include a metal bonding in which the first bonding structure 240 and the second bonding structure 192 are bonded, and an insulation-layer bonding in which the first insulation layer 250 and the second insulation layer 190 are bonded. For example, the hybrid bonding may be performed by performing an annealing process while the circuit region 200 and the preliminary cell region 100*a* are in contact with each other.

Figure 4D:
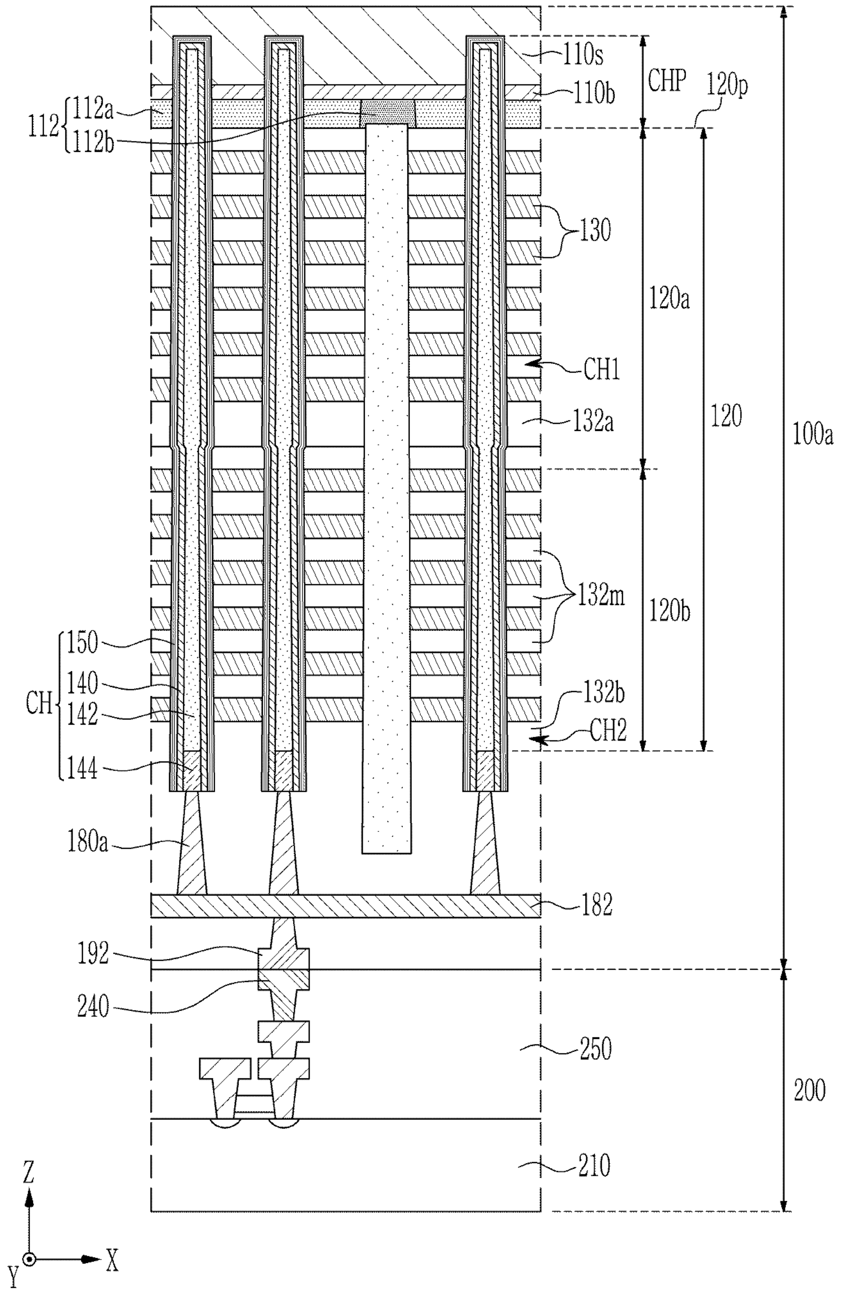

Subsequently, as shown in FIG. 4D, the semiconductor substrate 110 (FIG. 4C) and the first etch-stopping layer 110*a* (FIG. 4C) may be removed. As a process for removing the semiconductor substrate 110 and the first etch-stopping layer 110*a*, any of various processes, e.g., an etching process, a chemical mechanical polishing process, and a peeling process may be applied.

For example, the semiconductor substrate 110 may be removed by performing a chemical mechanical polishing process and then performing a wet etching process using an etching material capable of etching the semiconductor substrate 110. The etching material of the semiconductor substrate 110 may be a material that is difficult to etch a material constituting the first etch-stopping layer 110*a* or has a low etch-rate for the first etch-stopping layer 110*a*. The channel structure CH may be protected in the process of removing the semiconductor substrate 110 by the first etch-stopping layer 110*a*. For example, the first etch-stopping layer 110*a* may be removed by any of various methods, e.g., a wet etching process using an etching material capable of etching the first etch-stopping layer 110*a*, a dry etching process, or the like.

Figure 4E:
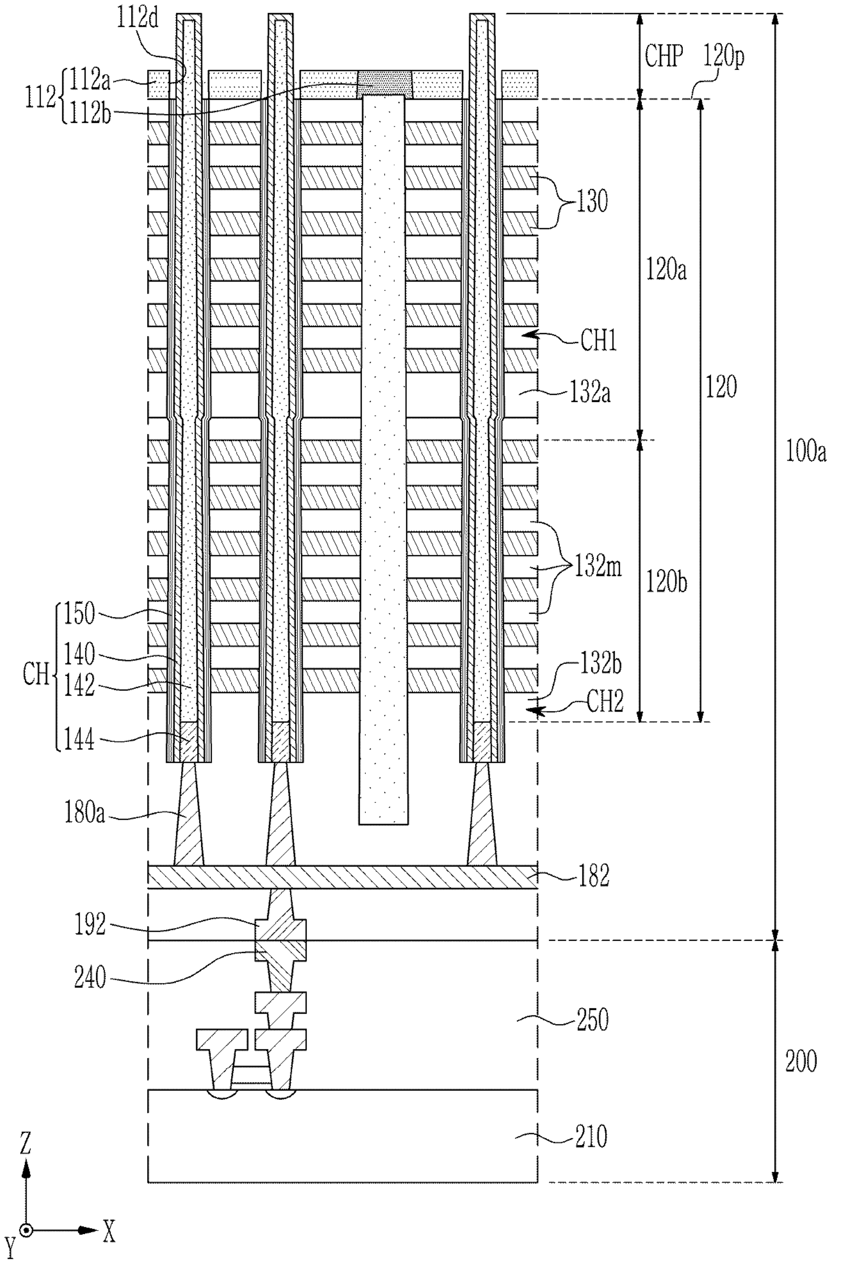

Subsequently, as shown in FIG. 4E, the doped monocrystalline semiconductor layer 112 may be exposed by removing the semiconductor layer 110*s* (FIG. 4D) and the second etch-stopping layer 110*b* (FIG. 4D). In addition, the gate dielectric layer 150 may be removed from the protruded portion CHP of the channel structure CH. Any of various processes, e.g., an etching process, may be applied as the process of removing the semiconductor layer 110*s* and the second etch-stopping layer 110*b* and the process of removing the gate dielectric layer 150.

For example, the semiconductor layer 110*s* may be removed using a wet etching process using an etching material capable of etching the semiconductor layer 110*s*. The etching material of the semiconductor layer 110*s* may be a material that is difficult to etch the material constituting the second etch-stopping layer 110*b* or has a low etch-rate for the second etch-stopping layer 110*b*. The doped monocrystalline semiconductor layer 112 may be protected in the process of removing the semiconductor layer 110*s* by the second etch-stopping layer 110*b*. For example, the second etch-stopping layer 110*b* may be removed by any of various methods, e.g., a wet etching process using an etching material capable of etching the second etch-stopping layer 110*b*, a dry etching process, or the like.

Subsequently, the gate dielectric layer 150 located at the protruded portion CHP of the channel structure CH may be partially or locally removed. A process of removing the gate dielectric layer 150 may be performed by a wet etching process using an etching material capable of etching the gate dielectric layer 150. The etching material of the gate dielectric layer 150 may be a material that is difficult to etch the channel layer 140 and the doped monocrystalline semiconductor layer 112 or has a low etch-rate for the channel layer 140 and doped monocrystalline semiconductor layer 112. For example, the etching material of the gate dielectric layer 150 may be a fluorine-based material.

When the gate dielectric layer 150 is removed, a first opening region 112*d* may be formed between a side surface of the doped monocrystalline semiconductor layer 112 and a side surface of the channel layer 140 provided at the protruded portion CHP of the channel structure CH. Accordingly, the side surface of the doped monocrystalline semiconductor layer 112 and the side surface of the channel layer 140 may be spaced apart from each other.

Figure 4F:
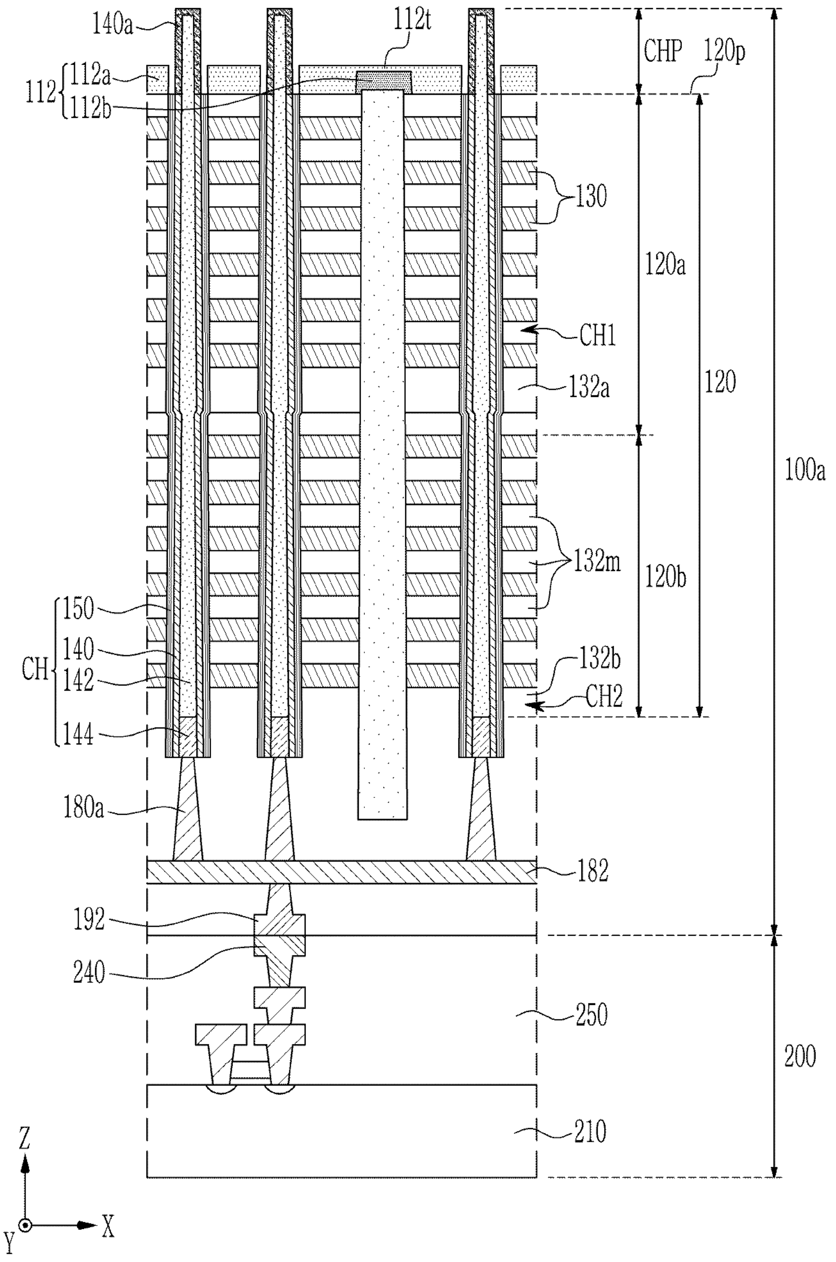

Subsequently, as shown in FIG. 4F, a doped channel layer 140*a* may be formed by doping a portion of the channel layer 140 located at the protruded portion CHP of the channel structure CH. Any suitable doping process may be performed.

For example, the doped channel layer 140*a* may be formed by an ion implantation process performed in a tilt state. That is, the ion implantation may be performed while rotating the semiconductor device at an inclined state. Correspondingly, the dopant may be stably doped into the channel layer 140 located at the protruded portion CHP without a channeling phenomenon. In another example, the doped channel layer 140*a* may be formed by a plasma doping process. By the plasma doping process, the dopant may be stably doped into the channel layer 140 located at the protruded portion CHP.

For example, in the doping process, the channel layer 140 of the protruded portion CHP may be doped with a first conductivity type dopant so that the doped channel layer 140*a* may have the first conductivity type. At this time, a surface of the doped monocrystalline semiconductor layer 112 may also be doped with the first conductivity type dopant. For example, in the first conductivity type region 112*a* of the horizontal portion 112*h* (FIG. 4I), a doping concentration of a first conductivity type dopant at a surface of the horizontal portion 112*h* may be higher than that at an inside of the horizontal portion 112*h*. In addition, a transition region 112*t* having an intrinsic or a first conductivity type may be formed at a surface of the second conductivity type region 112*b* provided in the connection portion 112*j*. However, the embodiment is not limited thereto, e.g., the transition region 112*t* may not be formed.

Figure 4G:
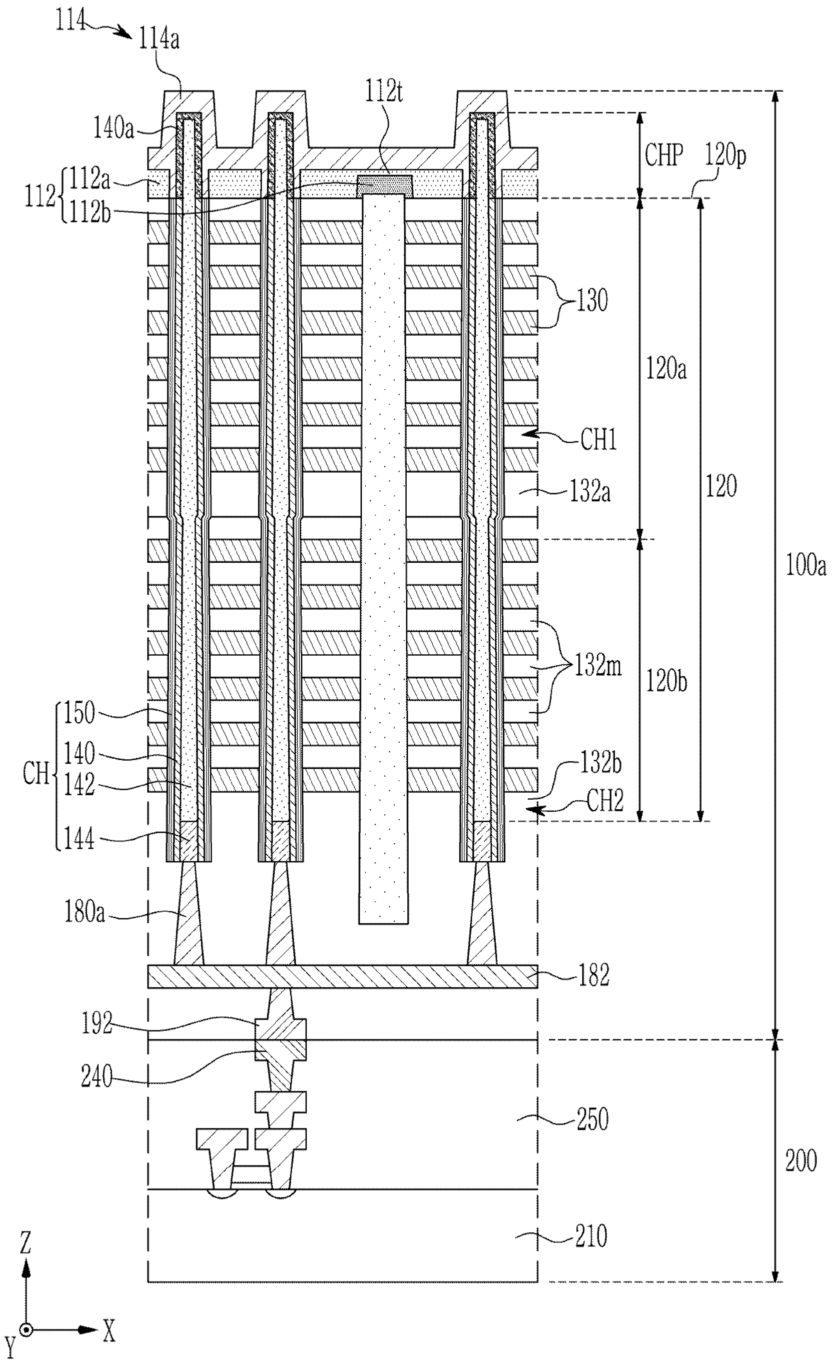

Subsequently, as shown in FIG. 4G, the doped polycrystalline semiconductor layer 114 may be formed on the doped monocrystalline semiconductor layer 112 and the protruded portion CHP of the channel structure CH, and the first surface 120*p* of the gate stacking structure 120 exposed therebetween. Next, an annealing process may be further performed.

A process of forming the doped polycrystalline semiconductor layer 114 may be performed using a deposition or the like. As the deposition, a chemical vapor deposition, an atomic layer deposition, etc. may be used. For example, the doped polycrystalline semiconductor layer 114 may include the first doped polycrystalline semiconductor layer 114*a* having a first conductivity type dopant.

For example, in a process of forming the first doped polycrystalline semiconductor layer 114*a*, a first conductivity type dopant may be included in the first doped polycrystalline semiconductor layer 114*a*. In another example, after forming the undoped polycrystalline semiconductor layer, the first doped polycrystalline semiconductor layer 114*a* may be formed by doping the undoped polycrystalline semiconductor layer with a first conductivity type dopant. An annealing process may be performed to improve properties of the first doped polycrystalline semiconductor layer 114*a* and to activate the dopant doped in the doped channel layer 140*a*.

Figure 4H:
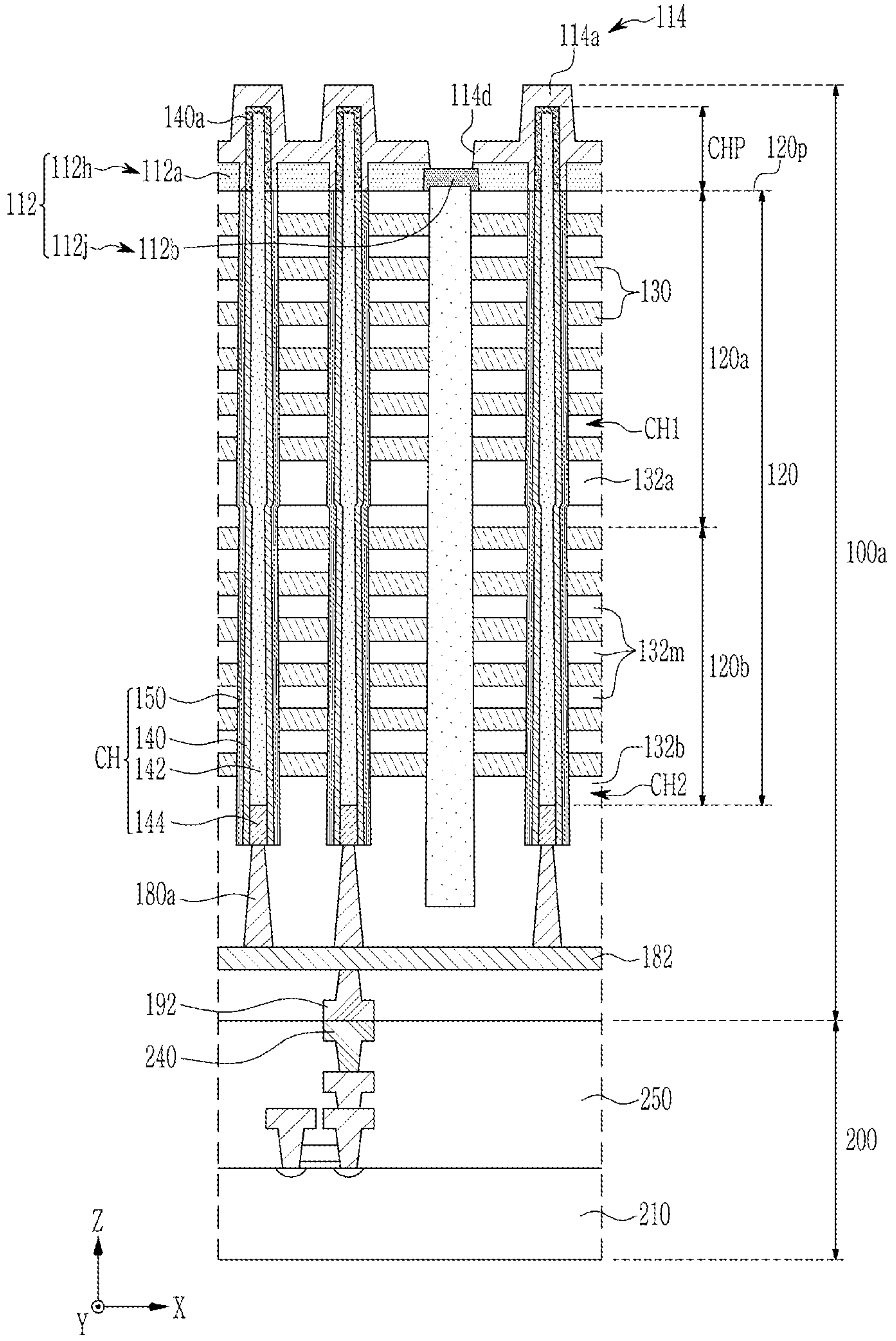

Subsequently, as shown in FIG. 4H, a second opening region 114*d* may be formed at a portion where the second contact portion 118 (FIG. 4I) is to be connected, by patterning the doped polycrystalline semiconductor layer 114. In the process of forming the second opening region 114*d*, the transition region 112*t* (FIG. 4G) formed at the second conductivity type region 112*b* constituting the connection portion 112*j* may be removed together. As a process for forming the second opening region 114*d*, any of various processes may be applied, e.g. a photolithography process and an etching process may be used.

Figure 4I:
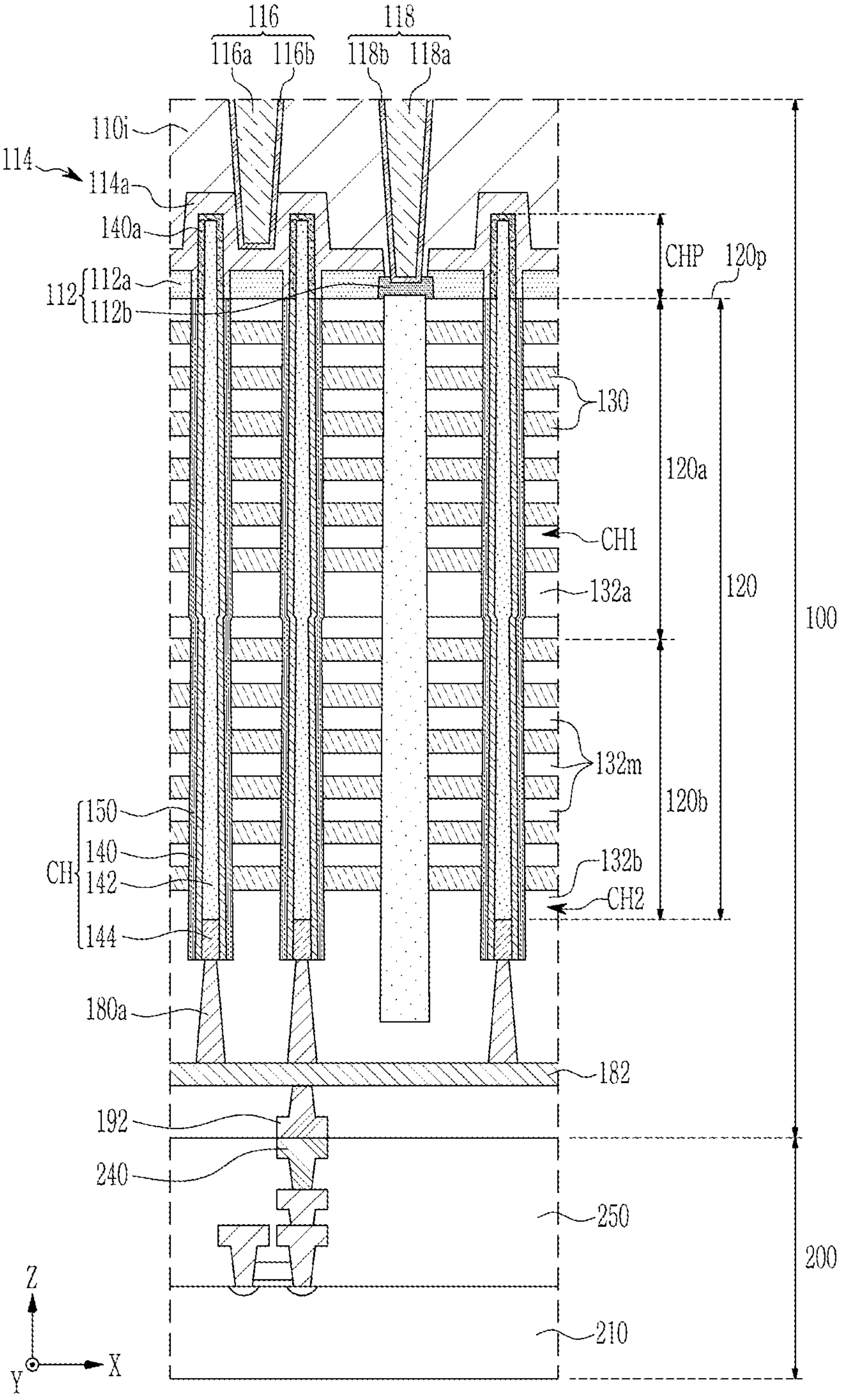

Subsequently, as shown in FIG. 4I, an insulation portion 110*i* may be formed to cover the horizontal conductive layers 112 and 114, and the first contact portion 116 and the second contact portion 118 may be formed.

The insulation portion 110*i* may be formed by any of various known methods, e.g., a deposition. After forming a first penetrating portion and a second penetrating portion penetrating the insulation portion 110*i*, a conductive material may be filled in the first penetrating portion and the second penetrating portion, respectively, to form the first contact portion 116 and the second contact portion 118. For example, the first penetrating portion may be formed to expose the first doped polycrystalline semiconductor layer 114*a*, and the second penetrating portion may be formed to expose the connection portion 112*j* or the second conductivity type region 112*b*.

In the embodiment, since the doped polycrystalline semiconductor layer 114 includes the first doped polycrystalline semiconductor layer 114*a*, the first contact portion 116 may be connected to (e.g., in direct contact with) the first doped polycrystalline semiconductor layer 114*a*. The second contact portion 118 may be connected to (e.g., in direct contact with) the connection portion 112*j* or the second conductivity type region 112*b*.

The manufacturing method described above is an example of a case where the doped monocrystalline semiconductor layer 112 includes a silicon layer. Hereinafter, a manufacturing method of a semiconductor device when a doped monocrystalline semiconductor layer 112 includes a silicon-germanium layer will be described in detail with reference to FIG. 5. Detailed descriptions for portions identical or substantially similar to those already described will be omitted, and other portions will be described in detail.

Figure 5:
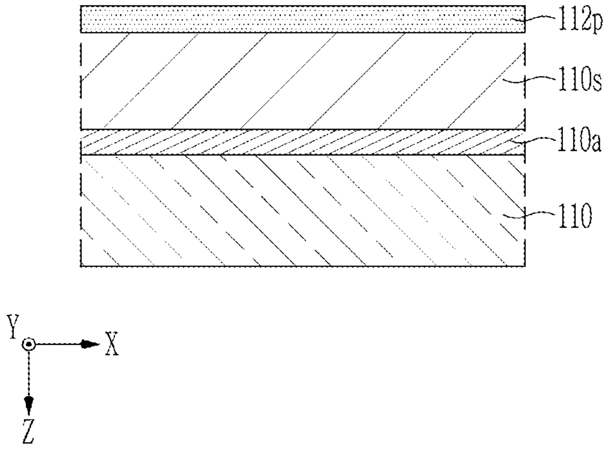
FIG. 5 is a partial cross-sectional view of a second substrate and a first doped monocrystalline semiconductor layer used in a manufacturing method of a semiconductor device according to a modified embodiment.

FIG. 5 is a partial cross-sectional view showing a second substrate and a first doped monocrystalline semiconductor layer used in a manufacturing method of a semiconductor device according to a modified embodiment.

As shown in FIG. 5, the first doped monocrystalline semiconductor layer 112*p* may be formed on the semiconductor substrate 110. For example, the first etch-stopping layer 110*a*, the semiconductor layer 110*s*, and the first doped monocrystalline semiconductor layer 112*p* may be formed on the semiconductor substrate 110. Here, the semiconductor substrate 110, the first etch-stopping layer 110*a*, and the semiconductor layer 110*s* may be referred to as a second substrate.

The semiconductor substrate 110 may be a semiconductor substrate including a semiconductor material. The first etch-stopping layer 110*a*, the semiconductor layer 110*s*, and the first doped monocrystalline semiconductor layer 112*p* may be a monocrystalline semiconductor layer or an epitaxial semiconductor layer formed by an epitaxial process. Here, the first etch-stopping layer 110*a*, the semiconductor layer 110*s*, and the first doped monocrystalline semiconductor layer 112*p* include a common material or element, but the first etch-stopping layer 110*a* and/or the first doped monocrystalline semiconductor layer 112*p* may be made of a different material from the semiconductor substrate 110 and the semiconductor layer 110*s*. For example, the first etch-stopping layer 110*a* and the first doped monocrystalline semiconductor layer 112*p* may include silicon-germanium, and the semiconductor substrate 110 and the semiconductor layer 110*s* may include silicon.

The first doped monocrystalline semiconductor layer 112*p* may include a first conductivity type dopant (e.g., a P-type dopant). In the process of forming the first doped monocrystalline semiconductor layer 112*p*, the first conductivity type dopant may be included in the first doped monocrystalline semiconductor layer 112*p*. As another example, after forming the undoped monocrystalline semiconductor layer, the first doped monocrystalline semiconductor layer 112*p* may be formed by doping the undoped monocrystalline semiconductor layer with a first conductivity type dopant.

As described above, when the first doped monocrystalline semiconductor layer 112*p* includes silicon-germanium, a second etch-stopping layer (reference numeral 110*b* in FIG. 4A) is not provided and the first doped monocrystalline semiconductor layer 112*p* is located on (e.g., in direct contact with) the semiconductor layer 110*s*. This is because the first doped monocrystalline semiconductor layer 112*p* may be used as a type of an etch-stopping layer by including silicon-germanium. Accordingly, a process may be simplified because a process of forming the second etch-stopping layer 110*b* may be omitted. In the case of using the second substrate and the first doped monocrystalline semiconductor layer 112*p*, the etching may be stopped by using the first doped monocrystalline semiconductor layer 112*p* as an etch-stopping layer in the process of removing the semiconductor layer 110*s*.

According to the embodiment, a semiconductor device 10 having excellent performance and reliability may be formed easily and with a stable process.

Hereinafter, a semiconductor device and a manufacturing method thereof according to a different embodiment from the above-described embodiment will be described in more detail with reference to FIGS. 6-7 and 8A-8E. Detailed descriptions for portions identical or extremely similar to those already described will be omitted, and other portions will be described in detail.

Figure 6:
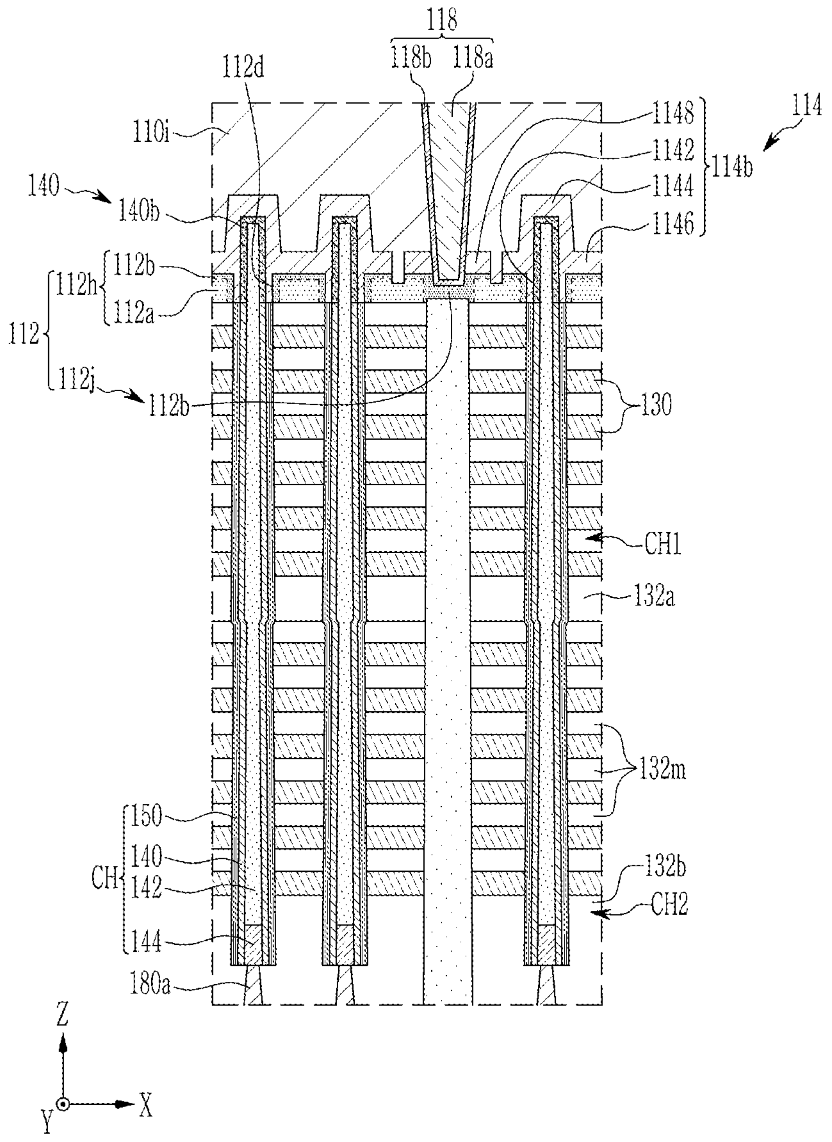
FIG. 6 is a partial cross-sectional view schematically of a semiconductor device according to another embodiment.
Figure 7:
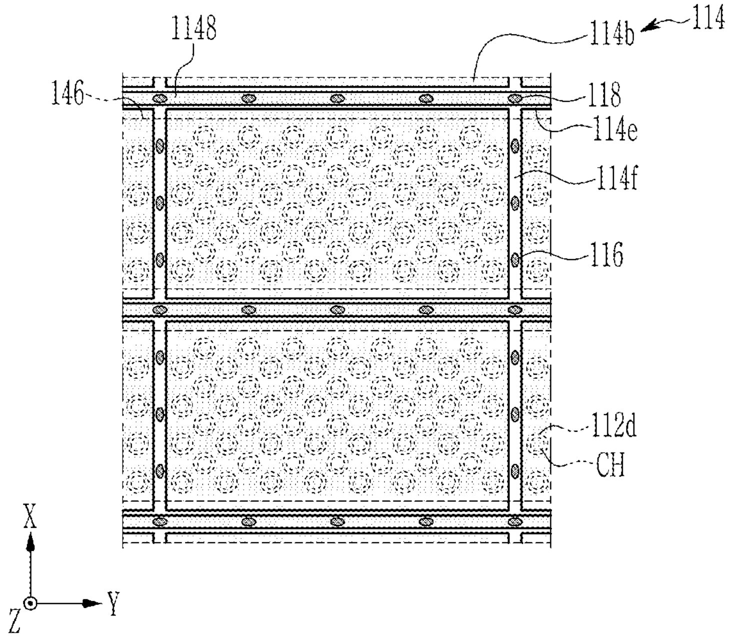
FIG. 7 is a partial top plan view showing a cell array region of the semiconductor device included in FIG. 6.

FIG. 6 is a partial cross-sectional view schematically showing a semiconductor device according to another embodiment (e.g., a view corresponding to FIG. 2). FIG. 7 is a partial top plan view showing a cell array region of the semiconductor device in FIG. 6, and shows a plane on which the doped polycrystalline semiconductor layer 114 is located and positions of the first contact portion 116 and the second contact portion 118.

Referring to FIG. 6 and FIG. 7, in a semiconductor device according to an embodiment, the doped polycrystalline semiconductor layer 114 may include a second doped polycrystalline semiconductor layer 114*b* having a second conductivity type (e.g., an N-type). In this case, the doped channel layer 140*b* provided at a protruded portion of the channel structure CH may have the same second conductivity type (e.g., the N-type) as the second doped polycrystalline semiconductor layer 114*b*.

In the doped monocrystalline semiconductor layer 112, the connection portion 112*j* may include the second conductivity type region 112*b*, and the horizontal portion 112*h* may include the first conductivity type region 112*a* and the second conductivity type region 112*b*. That is, in the connection portion 112*j* of the doped monocrystalline semiconductor layer 112, the second conductivity type region 112*b* may be located as a whole in a thickness direction. The horizontal portion 112*h* of the doped monocrystalline semiconductor layer 112 may include the first conductivity type region 112*a* located adjacent to (e.g., in direct contact with) one surface of the gate stacking structure 120, and the second conductivity type region 112*b* formed at a surface of the first conductivity type region 112*a*. Accordingly, the second doped polycrystalline semiconductor layer 114*b* may be located adjacent to (e.g., in direct contact with) the second conductivity type region 112*b* in the connection portion 112*j* and the horizontal portion 112*h*.

In an embodiment, the first conductivity type region 112*a* provided in the horizontal portion 112*h* may be a region having a first conductivity type dopant (e.g., may not have a second conductivity type dopant). The first conductivity type region 112*a* may have the first conductivity type dopant and the second conductivity type dopant, and may include the first conductivity type dopant more than the second conductivity type dopant. For example, the second conductivity type dopant provided in the first conductivity type region 112*a* of the horizontal portion 112*h* may be diffused from the second conductivity type region 112*b* of the horizontal portion 112*h*.

In an embodiment, the second conductivity type region 112*b* provided in the connection portion 112*j* and the horizontal portion 112*h* may include both the first conductivity type dopant and the second conductivity type dopant, and a content and a doping concentration of the second conductivity type dopant may be higher than that of the first conductivity type dopant. That is, the second conductivity type region 112*b* provided in the connection portion 112*j* and the horizontal portion 112*h* may include the first conductivity type dopant, but the second conductivity type dopant may be overdoped to be included at a higher concentration than the first conductivity type dopant, thereby having the second conductivity type.

At this time, in the connection portion 112*j* of the second conductivity type region 112*b*, a doping concentration of the second conductivity type dopant included at a surface of the connection portion 112*j* may be higher than at an inside of the connection portion 112*j*. In addition, a doping concentration of the second conductivity type region 112*b* at a surface of the connection portion 112*j* may be higher than a doping concentration of the second conductivity type region 112*b* at a surface of the horizontal portion 112*h*. The second conductivity type region 112*b* at the surface of the horizontal portion 112*h* is a region formed by a doping process in the process of forming the doped channel layer 140*b*. The inside of the second conductivity type region 112*b* included in the connection portion 112*j* is a region formed by a doping process for forming the connection portion 112*j*. The surface of the second conductivity type region 112*b* included in the connection portion 112*j* is a region formed by performing the doping process for forming the connection portion 112*j* and the doping process in the process for forming the doped channel layer 140*b*. Accordingly, the second conductivity type region 112*b* may have the above-described doping profile.

In an embodiment, at least two of the second doped polycrystalline semiconductor layer 114*b*, the doped channel layer 140*b*, and the second conductivity type region 112*b* having the same second conductivity type dopant have the same material or element as the second conductivity type dopant. For example, at least two second conductivity type dopants among the second doped polycrystalline semiconductor layer 114*b*, the doped channel layer 140*a*, and the second conductivity type region 112*b* may be the same material or element.

In another embodiment, at least two of the second doped polycrystalline semiconductor layer 114*b*, the doped channel layer 140*b*, and the second conductivity type region 112*b* may have different materials or elements as the second conductivity type dopant. Alternatively, the connection portion 112*j* may include a second conductivity type dopant of a material or element different from a second conductivity type dopant included in the horizontal portion 112*h*. This is because at least two of the second conductivity type dopant used for doping the second doped polycrystalline semiconductor layer 114*b*, the second conductivity type dopant used for doping a surface of the second conductivity type region 112*b* located at the horizontal portion 112*h* and/or the doped channel layer 140*b*, the second conductivity type dopant used for doping the connection portion 112*j* may be different.

When viewed in a plan view, the doped monocrystalline semiconductor layer 112 may be entirely formed except for the first opening region 112*d* where the channel structure CH is located therein. At this time, the second conductivity type region 112*b* provided in the connection portion 112*j* and the first conductivity type region 112*a* provided in the horizontal portion 112*h* may be formed as a junction to form a pn junction. At portions adjacent to both edges of the separation structure 146 extending in a first direction (a Y-axis direction of the drawing), a pn junction may extend along the first direction. In addition, the first conductivity type region 112*a* and the second conductivity type region 112*b* constituting the horizontal portion 112*h* may be formed as a junction to form a pn junction.

The second doped polycrystalline semiconductor layer 114*b* may include the connection portion 1142. The connection portion 1142 may be located within at least the first opening region 112*d*. The connection portion 1142 may connect a side surface of the channel structure CH (e.g., the doped channel layer 140*b* of the protruded portion CHP) and a side surface of the doped monocrystalline semiconductor layer 112, which are spaced apart from each other at the first surface 120*p* of the gate stacking structure 120 in a horizontal direction. In further detail, the connection portion 1142 may be located on (e.g., in direct contact with) the first surface 120*p* of the gate stacking structure 120 while filling the first opening region 112*d* formed by a removal of the gate dielectric layer 150 at the protruded portion CHP. For example, the connection portion 1142 may be in contact with the side surface of the doped channel layer 140*a* and the side surface of the doped monocrystalline semiconductor layer 112 in the first opening region 112*d*.

Also, the second doped polycrystalline semiconductor layer 114*b* may further include the protruded portion 1144 and the horizontal portion 1146. The protruded portion 1144 may be located on (e.g., in direct contact with) a side surface and a bottom surface (an upper surface of FIG. 6) of the protruded portion CHP to cover the protruded portion CHP of the channel structure CH, and may be protruded toward an outer surface (an upper surface of FIG. 6) of an insulation portion 110*i*. The horizontal portion 1146 may be located on (e.g., in direct contact with) the doped monocrystalline semiconductor layer 112.

Also, the second doped polycrystalline semiconductor layer 114*b* may further include a contact portion 1148 on the connection portion 112*j*. The contact portion 1148 may be spaced apart from the connection portion 1142, the protruded portion 1144, and the horizontal portion 1146 located at the horizontal portion 112*h* by a slit portion 114*e*. The contact portion 1148, together with the connection portion 112*j* of the doped monocrystalline semiconductor layer 112, may be a portion connected to (e.g., in direct contact with) the second contact portion 118.

The slit portion 114*e* may be a portion from which the second doped polycrystalline semiconductor layer 114*b* is removed to separate the contact portion 1148 from other portions of the second doped polycrystalline semiconductor layer 114*b*. For example, the second conductivity type region 112*b* provided at a surface of the horizontal portion 112*h* of the doped monocrystalline semiconductor layer 112 may be removed together by the slit portion 114*e*.

Due to the slit portion 114*e*, a current may stably flow through a depletion region and the second conductivity type region 112*b* of the connection portion 112*j* during a read operation. For example, the slit portion 114*e* may have a shape extending along the first direction (the Y-axis direction of the drawing). Alternatively, the second doped polycrystalline semiconductor layer 114*b* may not include the contact portion 1148. Then, as shown in FIG. 3, a second opening region 114*d* may be provided in the second doped polycrystalline semiconductor layer 114*b*.

At this time, the second doped polycrystalline semiconductor layer 114*b* may be connected to (e.g., in direct contact with) the second conductivity type region 112*b* (the connection portion 112*j* and the horizontal portion 112*h*), and the doped channel layer 140*b*, and may be spaced apart from the first conductivity type region 112*a*.

In an embodiment, the second doped polycrystalline semiconductor layer 114*b* and the second conductivity type region 112*b* located at the surface of the horizontal portion 112*h* may include a third opening region 114*f* for an electrical connection of the first contact portion 116 and the first conductivity type region 112*a* provided on the horizontal portion 112*h*. The third opening region 114*f* may be a portion from which the second doped polycrystalline semiconductor layer 114*b* and the second conductivity type region 112*b* adjacent thereto are removed. For example, the third opening region 114*f* may extend in the second direction (the X-axis direction of the drawing) between two second opening regions 114*d* or two separation structures 146 adjacent to each other. The third opening region 114*f* may be located in plurality with a regular interval in the first direction (the Y-axis direction of the drawing).

For example, FIG. 7 illustrates a plurality of first contact portions 116 that are located in one third opening region 114*f*. Accordingly, a patterning process to form the third opening region 114*f* may be easily performed. Therefore, the third opening region 114*f* may be provided to correspond to each first contact portion 116.

Also, in FIG. 7, the second doped polycrystalline semiconductor layer 114*b* may be entirely formed at a portion except for the slit portion 114*e* and the third opening region 114*f*. Accordingly, the second doped polycrystalline semiconductor layer 114*b* may be formed of a single portion entirely formed between two separation structures 146 adjacent to each other and two third opening regions 114*f* adjacent to each other. The second doped polycrystalline semiconductor layer 114*b* or the doped polycrystalline semiconductor layer 114 may include a plurality of portions spaced apart from each other between two separation structures 146 adjacent to each other and two third opening regions 114*f* adjacent to each other, as will be descried in detail with reference to FIG. 9.

For example, the first contact portion 116 may pass through the second doped polycrystalline semiconductor layer 114*b* and the second conductivity type region 112*b* provided in the horizontal portion 112*h* of the doped monocrystalline semiconductor layer 112. The first contact portion 116 may be spaced apart from the second doped polycrystalline semiconductor layer 114*b* and the second conductivity type region 112*b* provided in the horizontal portion 112*h*. The first contact portion 116 may be connected (e.g., directly connected) to the first conductivity type region 112*a* provided in the horizontal portion 112*h* of the doped monocrystalline semiconductor layer 112. The second contact portion 118 may be connected (e.g., directly connected) to the second doped polycrystalline semiconductor layer 114*b* and/or the second conductivity type region 112*b* provided in the connection portion 112*j* of the doped monocrystalline semiconductor layer 112.

In FIG. 7, it is illustrated that the first contact portion 116 has an elliptical shape with a major axis in the second direction (the X-axis direction of the drawing) and a minor axis in the first direction (the Y-axis direction of the drawing), and the second contact portion 118 has an elliptical shape with a major axis in the first direction and a minor axis in the second direction. Accordingly, a patterning process may be easily performed, and a connection area between the first contact portion 116 and the first conductivity type region 112*a* and/or a connection area between the second contact portion 118 and the second conductivity type region 112*b* may be sufficiently secured. However, the embodiment is not limited thereto, e.g., the major axis direction of the first contact portion 116 and/or the second contact portion 118 may be different, and the first contact portion 116 and/or the second contact portion 118 may have any suitable shape e.g., circular, polygonal, linear, irregular, etc.

According to an embodiment, the horizontal conductive layers 112 and 114 may include a doped monocrystalline semiconductor layer 112 to reduce a leakage current, thereby improving performance and reliability of a semiconductor device. At this time, since a bulk erase operation may be applied, a stable erase operation may be performed regardless of a number of the gate electrodes 130 or a number of the memory cells.

An example of a manufacturing method of the above semiconductor device will be explained in detail with reference to FIG. 8A to FIG. 8E along with FIGS. 6 and 7. The detailed descriptions for portions that have already been explained will be omitted, and descriptions for portions that have not been explained will be given in detail.

FIG. 8A to FIG. 8E are partial cross-sectional views of stages in a manufacturing method of a semiconductor device according to another embodiment. FIG. 8A to FIG. 8E show a part of the cell array region. Hereinafter, the manufacturing method of the semiconductor device will be mainly explained based on the horizontal conductive layers 112 and 114, the gate stacking structure 120, the channel structure CH, and the separation structure 146, which are formed in a cell region.

Figure 8A:
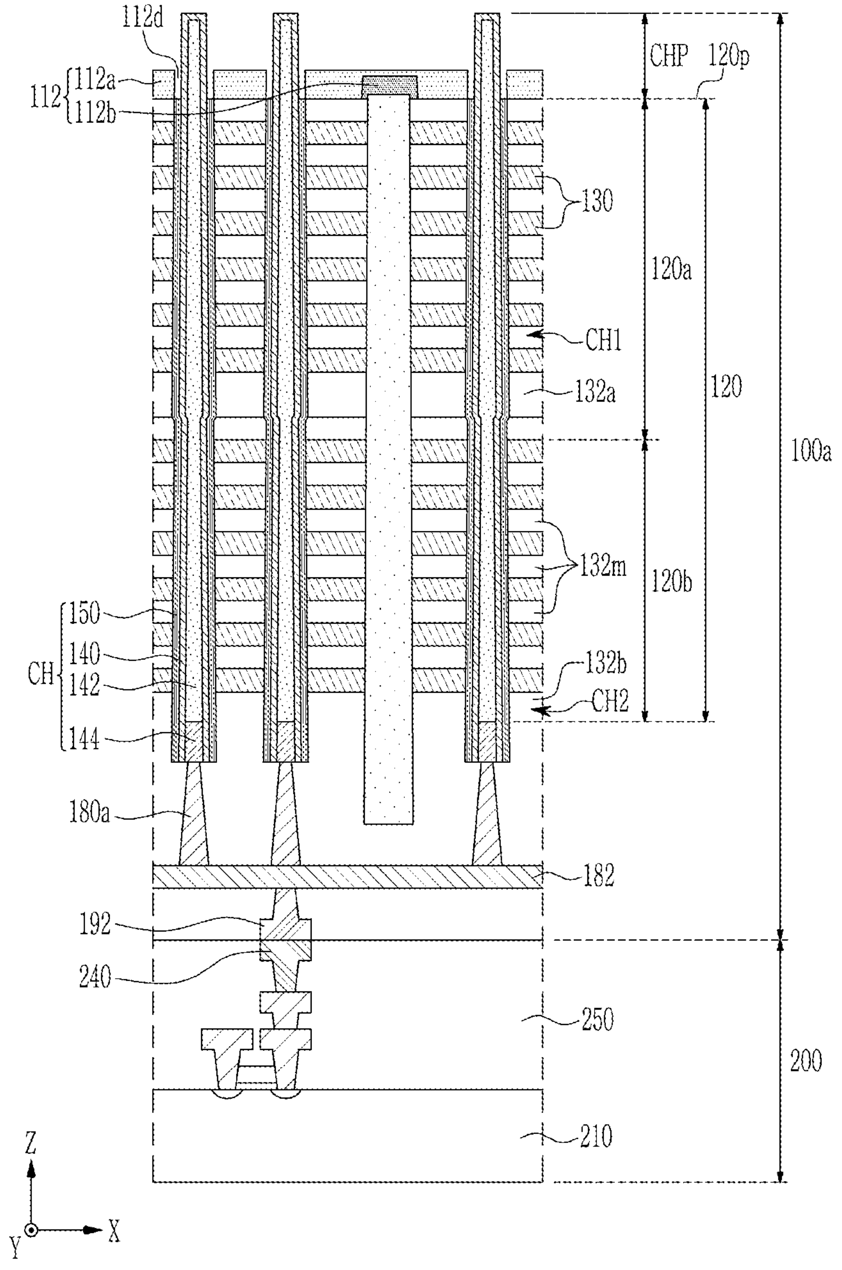
FIG. 8A to FIG. 8E are partial cross-sectional views of stages in a manufacturing method of a semiconductor device according to another embodiment.

As shown in FIG. 8A, a preliminary cell region 100*a* may be formed to be bonded to the circuit region 200, the second substrate may be removed, and the gate dielectric layer 150 may be removed from the protruded portion CHP of the channel structure CH. The process of forming the preliminary cell region 100*a*, the boding process to the circuit region 200, the process of removing the second substrate, and the process of removing the gate dielectric layer 150 may be performed as described previously with reference to FIGS. 4A-4E and 5. At this time, for the second substrate, the second substrate shown in FIG. 4A may be used, a second substrate without a second etch-stopping layer (reference numeral 110*b* in FIG. 4A) shown in FIG. 5 may be used, etc.

Figure 8B:
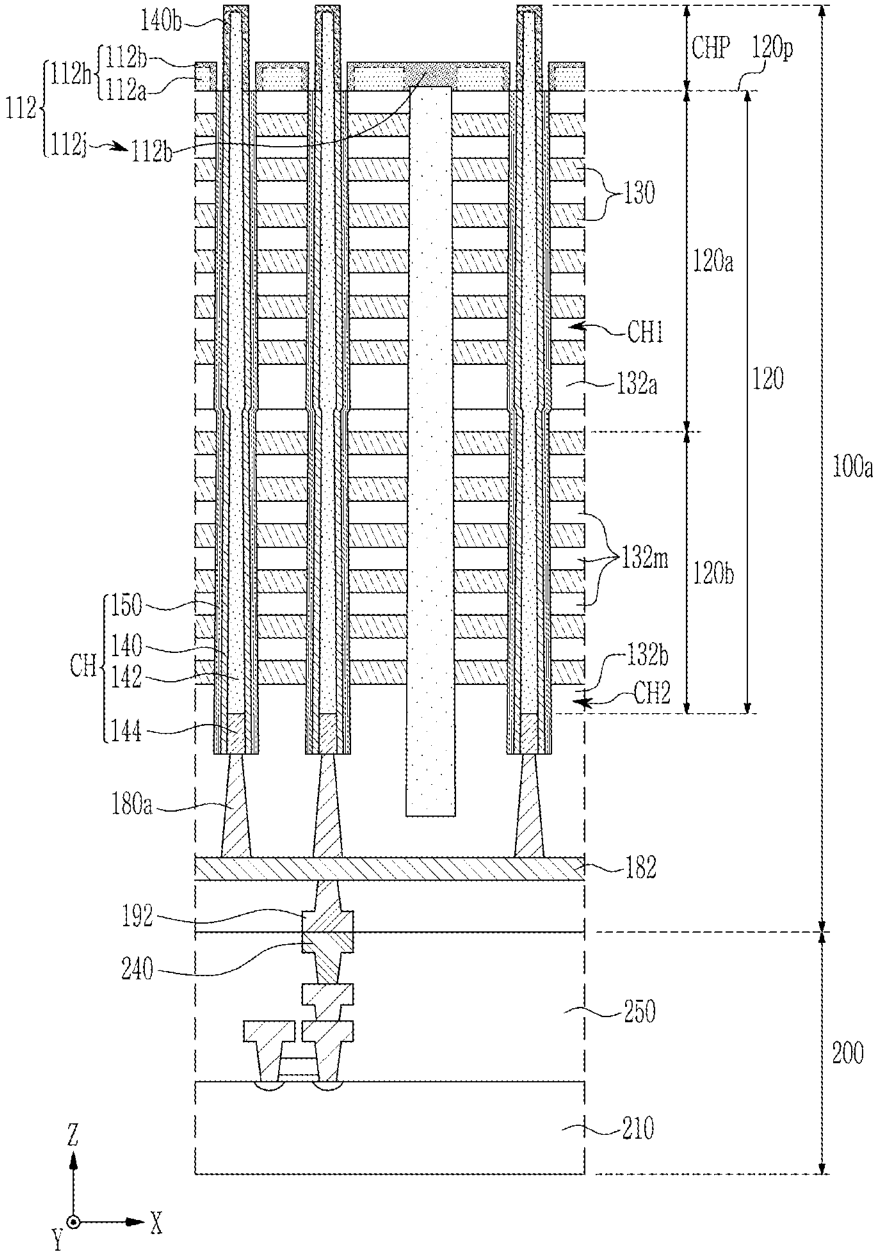

Subsequently, as shown in FIG. 8B, the doped channel layer 140*b* may be formed by doping a portion of the channel layer 140 located at the protruded portion CHP of the channel structure CH. For example, the doped channel layer 140*b* may be formed by an ion implantation process in a tilted state or a plasma doping process performed.

For example, in the doping process, the channel layer 140 of the protruded portion CHP may be doped with a second conductivity type dopant so that the doped channel layer 140*b* may have a second conductivity type. At this time, a surface of the doped monocrystalline semiconductor layer 112 may also be doped with the second conductivity type dopant. For example, in a second conductivity type region 112*b* of the connection portion 112*j* (FIG. 6), a doping concentration of a second conductivity type dopant at a surface of the connection portion 112*j* may be higher than that at an inside of the connection portion 112*j*. In the horizontal portion 112*h*, a second conductivity type region 112*b* may be formed at a surface of the first conductivity type region 112*a*. A doping concentration of the second conductivity type region 112*b* located at the surface of the connection portion 112*j* may be higher than a doping concentration of the second conductivity type region 112*b* located at the surface of the horizontal portion 112*h*.

Figure 8C:
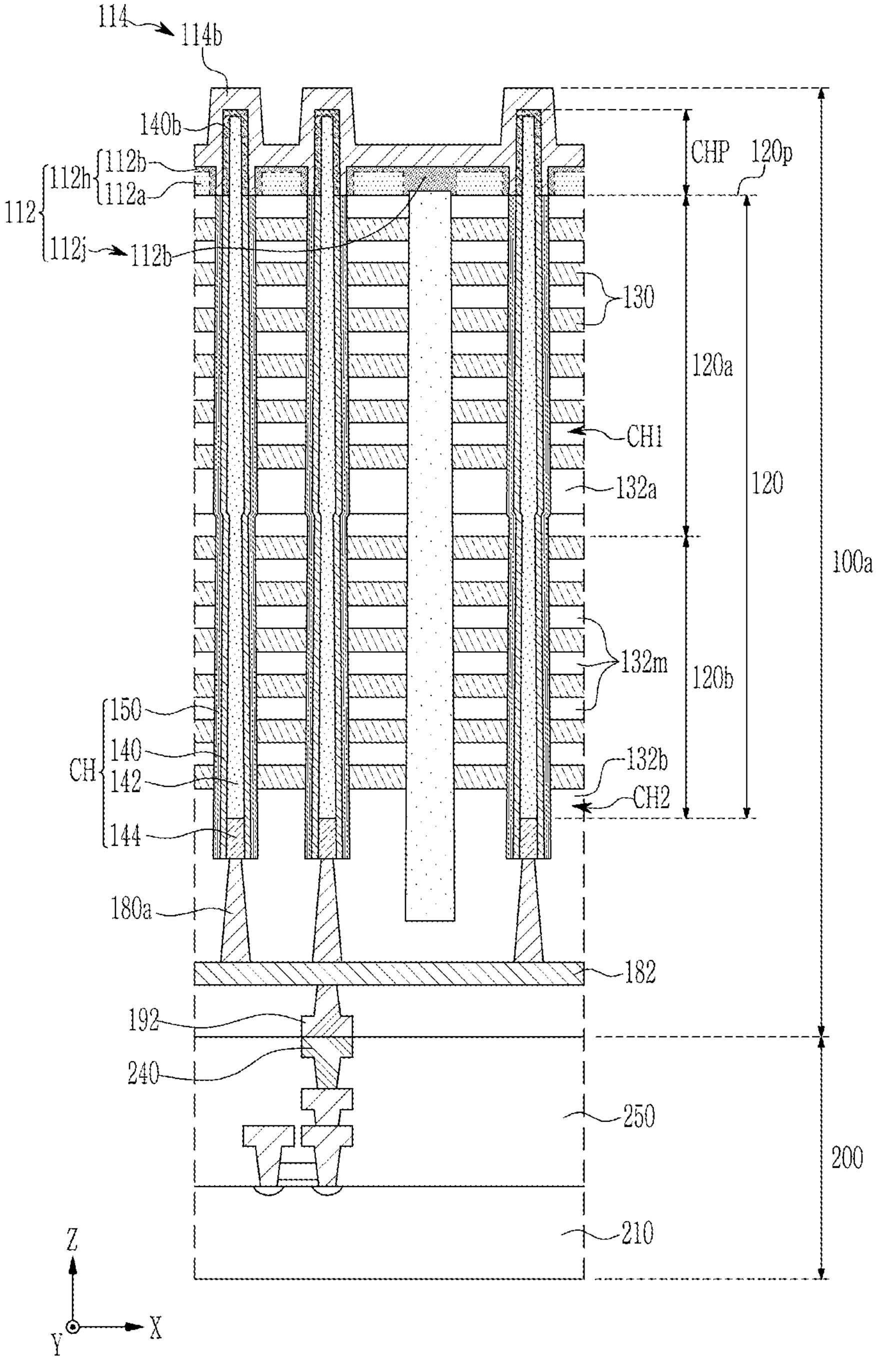

Next, as shown in FIG. 8C, a doped polycrystalline semiconductor layer 114 may be formed on the doped monocrystalline semiconductor layer 112 and the protruded portion CHP of the channel structure CH, and the first surface 120*p* of the gate stacking structure 120 exposed therebetween. Also, an annealing process may be further performed.

A process of forming the doped polycrystalline semiconductor layer 114 may be performed using a deposition or the like. As a deposition, a chemical vapor deposition, an atomic layer deposition, etc. may be used.

For example, the doped polycrystalline semiconductor layer 114 may include a second doped polycrystalline semiconductor layer 114*b* having a second conductivity type dopant. In a process of forming the second doped polycrystalline semiconductor layer 114*b*, a second conductivity type dopant may be included in the second doped polycrystalline semiconductor layer 114*b*. As another example, after forming the undoped polycrystalline semiconductor layer, the second doped polycrystalline semiconductor layer 114*b* may be formed by doping the undoped polycrystalline semiconductor layer with the second conductivity type dopant.

An annealing process may be performed to improve properties of the second doped polycrystalline semiconductor layer 114*b* and activate the dopant doped in the doped channel layer 140*b*.

Figure 8D:
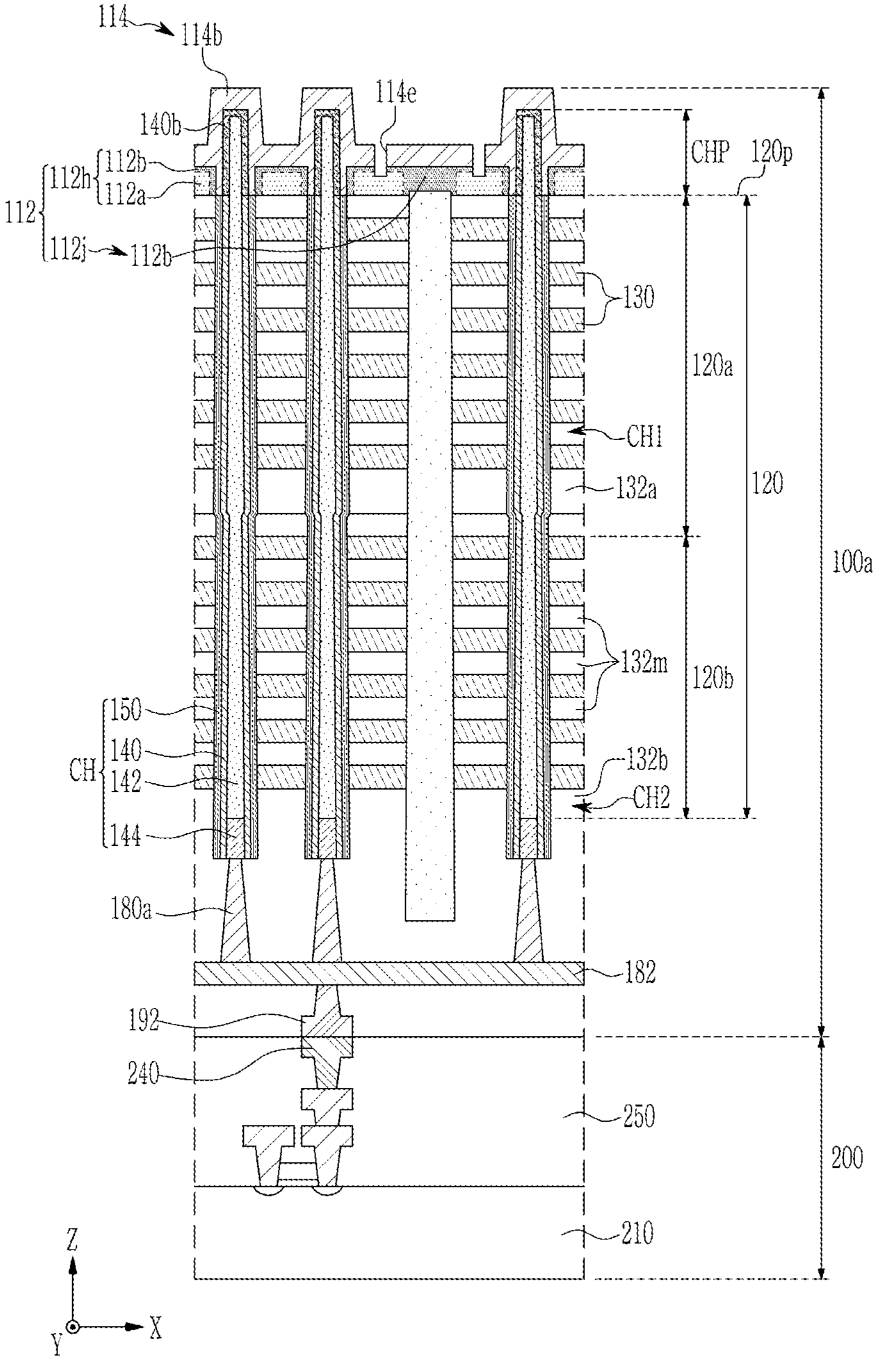

Subsequently, as shown in FIG. 8D, the slit portion 114*e* and the third opening region 114*f* may be formed by patterning the doped polycrystalline semiconductor layer 114 and/or the second conductivity type region 112*b* included in the horizontal portion 112*h*. As a process for forming the slit portion 114*e* and the third opening region 114*f*, any of suitable processes may be applied, e.g., a photolithography process and an etching process.

Figure 8E:
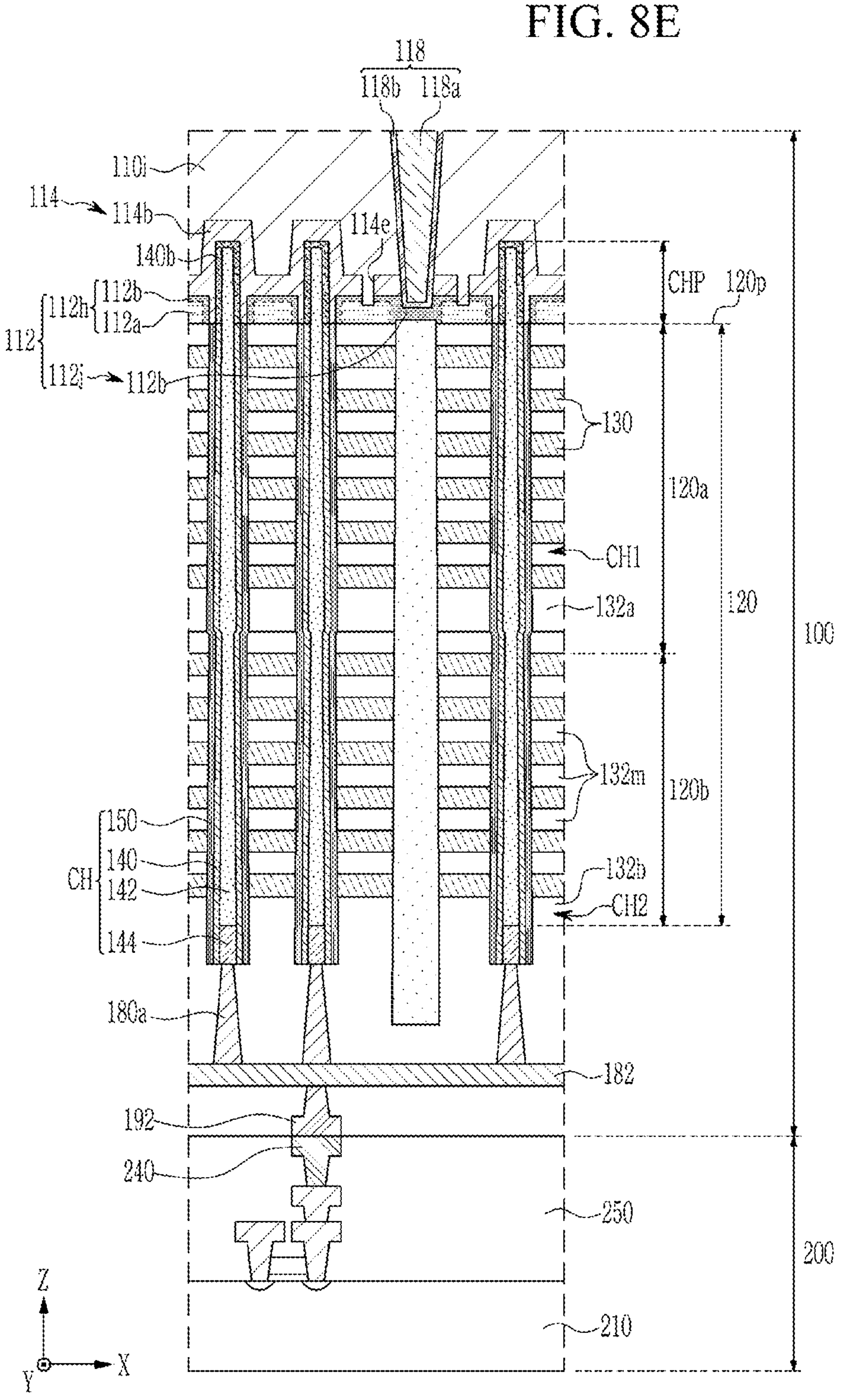

Subsequently, as shown in FIG. 8E, the insulation portion 110*i* may be formed to cover the horizontal conductive layers 112 and 114, and the first contact portion 116 (FIG. 7) and the second contact portion 118 may be formed.

The insulation portion 110*i* may be formed, e.g., by a deposition. After forming a first penetrating portion and a second penetrating portion penetrating the insulation portion 110*i*, a conductive material may be filled in the first penetrating portion and the second penetrating portion, respectively, to form the first contact portion 116 and the second contact portion 118. For example, the first penetrating portion may be formed to expose the first conductivity type region 112*a* included in the horizontal portion 112*h*, and the second penetrating portion may be formed to expose the second conductivity type region 112*b* included in the connection portion 112*j*. Then, the first contact portion 116 may be connected to (e.g., in contact with) the first conductivity type region 112*a* provided in the horizontal portion 112*h*, and the second contact portion 118 may be connected to (e.g., in contact with) the second conductivity type region 112*b* provided in the connection portion 112*j*.

According to an embodiment, a semiconductor device having excellent performance and reliability may be formed easily and with a stable process.

Figure 9:
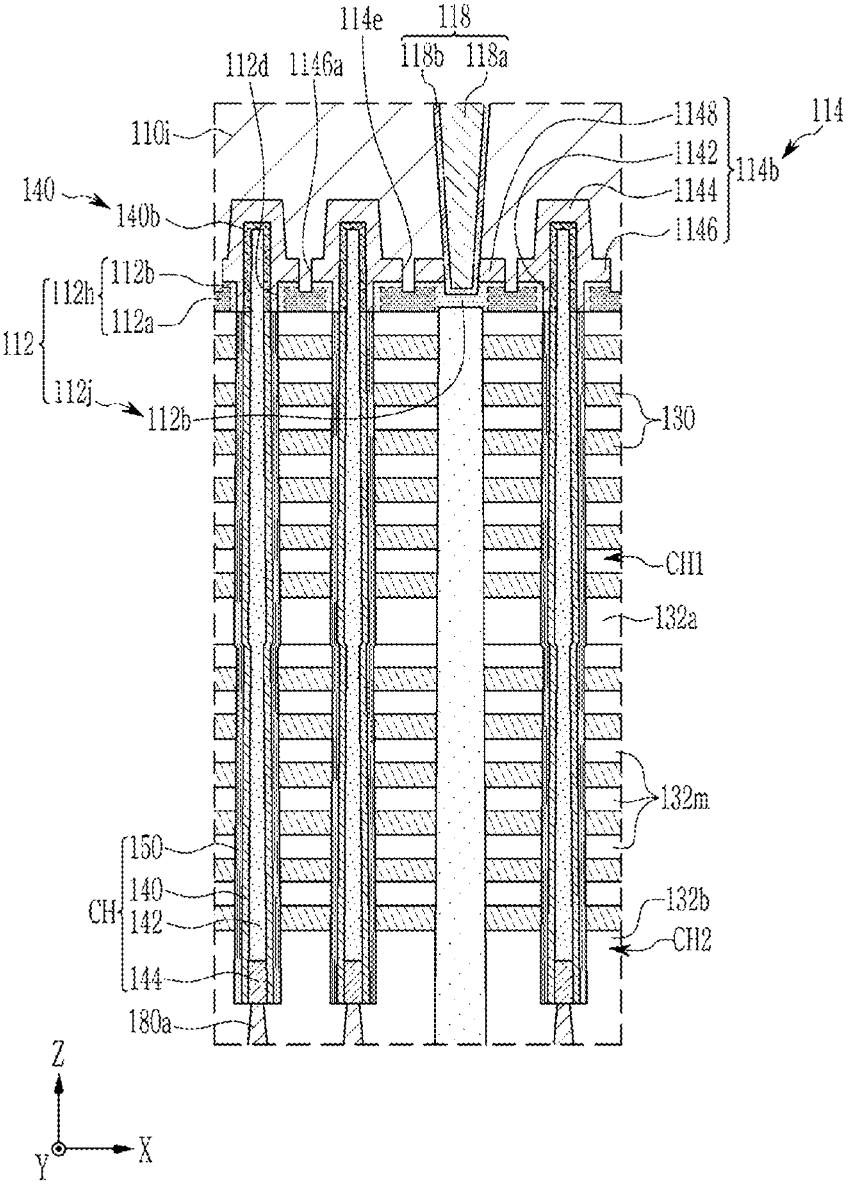
FIG. 9 is a cross-sectional view of a semiconductor device according to another embodiment.

FIG. 9 is a cross-sectional view schematically showing a semiconductor device according to another embodiment.

Referring to FIG. 9, in an embodiment, a separation portion 1146*a* in which a part of the horizontal portion 1146 of the doped polycrystalline semiconductor layer 114 is removed may be formed. By the separation portion 1146*a*, the doped polycrystalline semiconductor layer 114 and/or the second conductivity type region 112*b* provided in the horizontal portion 112*h* may have a plurality of patterns spaced apart from each other between two adjacent separation structures 146. The separation portion 1146*a* may be formed in a process of patterning the second opening region 114*d* (FIG. 3), the slit portion 114*e* (FIG. 7), and the third opening region 114*f* (FIG. 7). Accordingly, a stability of a mask used in a patterning process may be improved.

For example, when the doped polycrystalline semiconductor layer 114 is composed of a second doped polycrystalline semiconductor layer 114*b*, the second doped polycrystalline semiconductor layer 114*b* may have a plurality of patterns spaced apart from each other between two adjacent separation structures 146 and two adjacent third opening regions 114*f* (FIG. 7). The separation portion 1146*a* may be extended in the first direction (a Y-axis direction of the drawing) or the second direction (an X-axis direction of the drawing).

FIG. 9 shows that the separation portion 1146*a* is provided to the embodiment shown in FIG. 6, but the separation portion 1146*a* may be also provided to the embodiment shown in FIG. 2. That is, when the doped polycrystalline semiconductor layer 114 is composed of the first doped polycrystalline semiconductor layer 114*a*, the first doped polycrystalline semiconductor layer 114*a* may have a plurality of patterns spaced apart from each other between two adjacent separation structures 146 or two adjacent second opening regions 114*d* (FIG. 3). The separation portion 1146*a* may be extended in the first direction (a Y-axis direction of drawing) or the second direction (an X-axis direction of the drawing).

Figure 10:
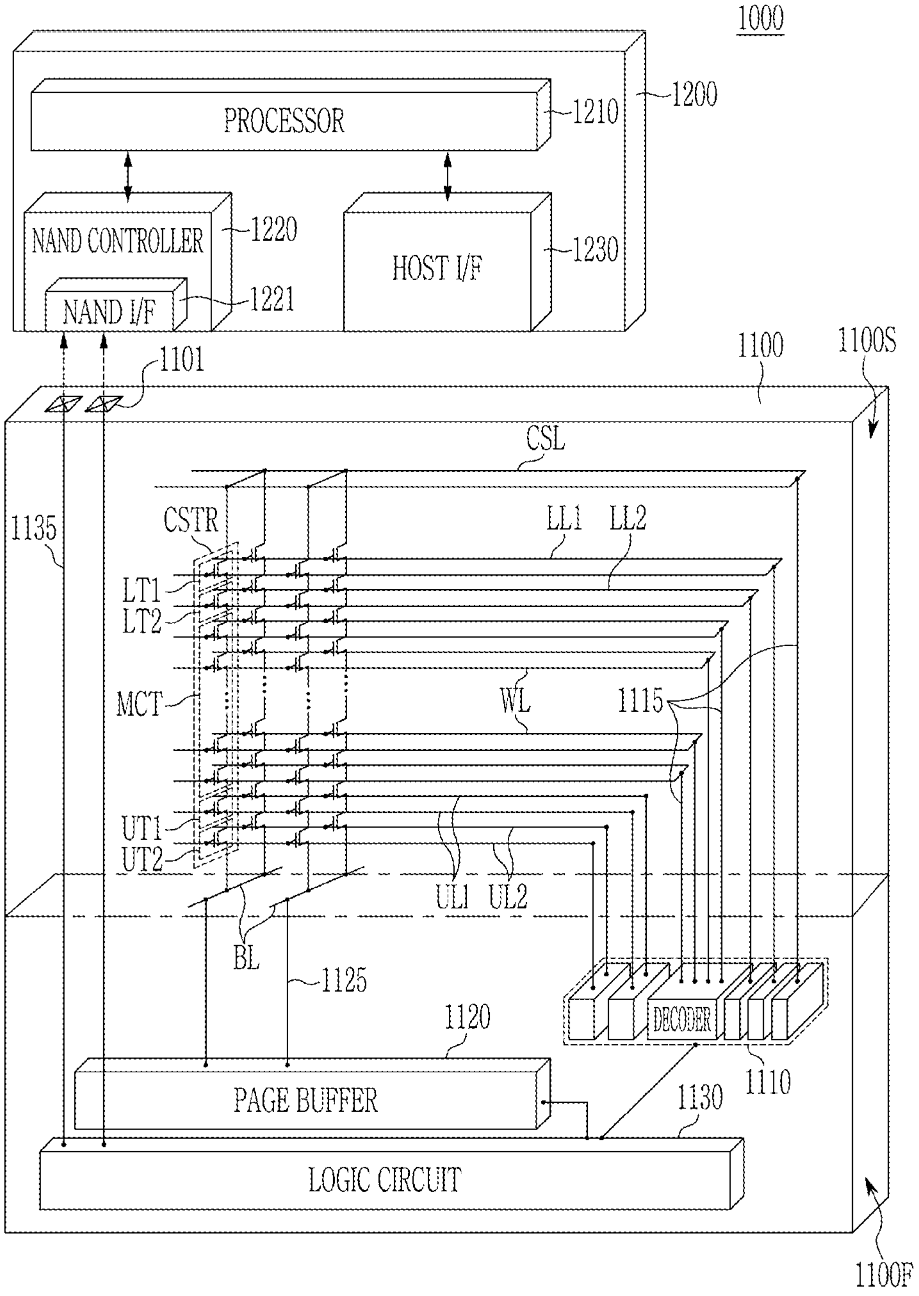
FIG. 10 is a view of an electronic system including a semiconductor device according to an embodiment.

An example of an electronic system including the semiconductor device as described above will be described in detail with reference to FIG. 10. FIG. 10 is a view schematically illustrating an electronic system including a semiconductor device according to an embodiment.

Referring to FIG. 10, in an embodiment, an electronic system 1000 may include a semiconductor device 1100 and a controller 1200 electrically connected to the semiconductor device 1100. The electronic system 1000 may be a storage device including one or a plurality of semiconductor devices 1100 or an electronic device including the storage device. For example, the electronic system 1000 may be a solid state drive device (SSD device), a universal serial bus (USB), a computing system, a medical device, or a communication device, including one or a plurality of semiconductor devices 1100.

The semiconductor device 1100 may be a non-volatile memory device, e.g., a NAND flash memory device described with reference to FIGS. 1-3, 4A-4I, FIGS. 5-7, 8A-8E, and 9. The semiconductor device 1100 may include a first structure 1100F and a second structure 1100S on the first structure 1100F. In an embodiment, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including a bitline BL, a common source line CSL, a wordline WL, first and second gate upper lines UL1 and UL2, first and second gate lower lines LL1 and LL2, and a memory cell string CSTR between the bitline BL and the common source line CSL.

In the second structure 1100S, each memory cell string CSTR may include lower transistors LT1 and LT2 adjacent to the common source line CSL, upper transistors UT1 and UT2 adjacent to the bitline BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously modified according to embodiments.

In an embodiment, the lower transistors LT1 and LT2 may include a ground selection transistor, and the upper transistors UT1 and UT2 may include a string selection transistor. The first and second gate lower lines LL1 and LL2 may be gate electrodes of lower transistors LT1 and LT2, respectively. The wordline WL may be a gate electrode of the memory cell transistor MCT, and the gate upper lines UL1 and UL2 may be gate electrodes of the upper transistors UT1 and UT2, respectively.

The common source line CSL, the first and second gate lower lines LL1 and LL2, the wordline WL, and the first and second gate upper lines UL1 and UL2 may be electrically connected to the decoder circuit 1110 through a first connection wire 1115 extending to the second structure 1100S in the first structure 1100F. The bitline BL may be electrically connected to the page buffer 1120 through a second connection wire 1125 extending to the second structure 1100S in the first structure 1100F.

In the first structure 1100F, the decoder circuit 1110 and the page buffer 1120 may perform the control operation for at least one memory cell transistor selected among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection wire 1135 extending to the second structure 1100S in the first structure 1100F.

The controller 1200 may include a processor 1210, a NAND controller 1220, and a host interface 1230. According to the embodiment, the electronic system 1000 may include a plurality of semiconductor devices 1100, and in this case, the controller 1200 may control the plurality of semiconductor devices 1100.

The processor 1210 may control the overall operation of the electronic system 1000 including the controller 1200. The processor 1210 may operate according to a predetermined firmware, and may access the semiconductor device 1100 by controlling the NAND controller 1220. The NAND controller 1220 may include a NAND interface 1221 that processes a communication with the semiconductor device 1100. Through the NAND interface 1221, a control instruction for controlling the semiconductor device 1100, a data to be written to the memory cell transistors MCT of the semiconductor device 1100, a data to be read from the memory cell transistors MCT of the semiconductor device 1100, and the like may be transmitted. The host interface 1230 may provide a communication function between the electronic system 1000 and an external host. When a control instruction is received from the external host through the host interface 1230, the processor 1210 may control the semiconductor device 1100 in response to the control instruction.

Figure 11:
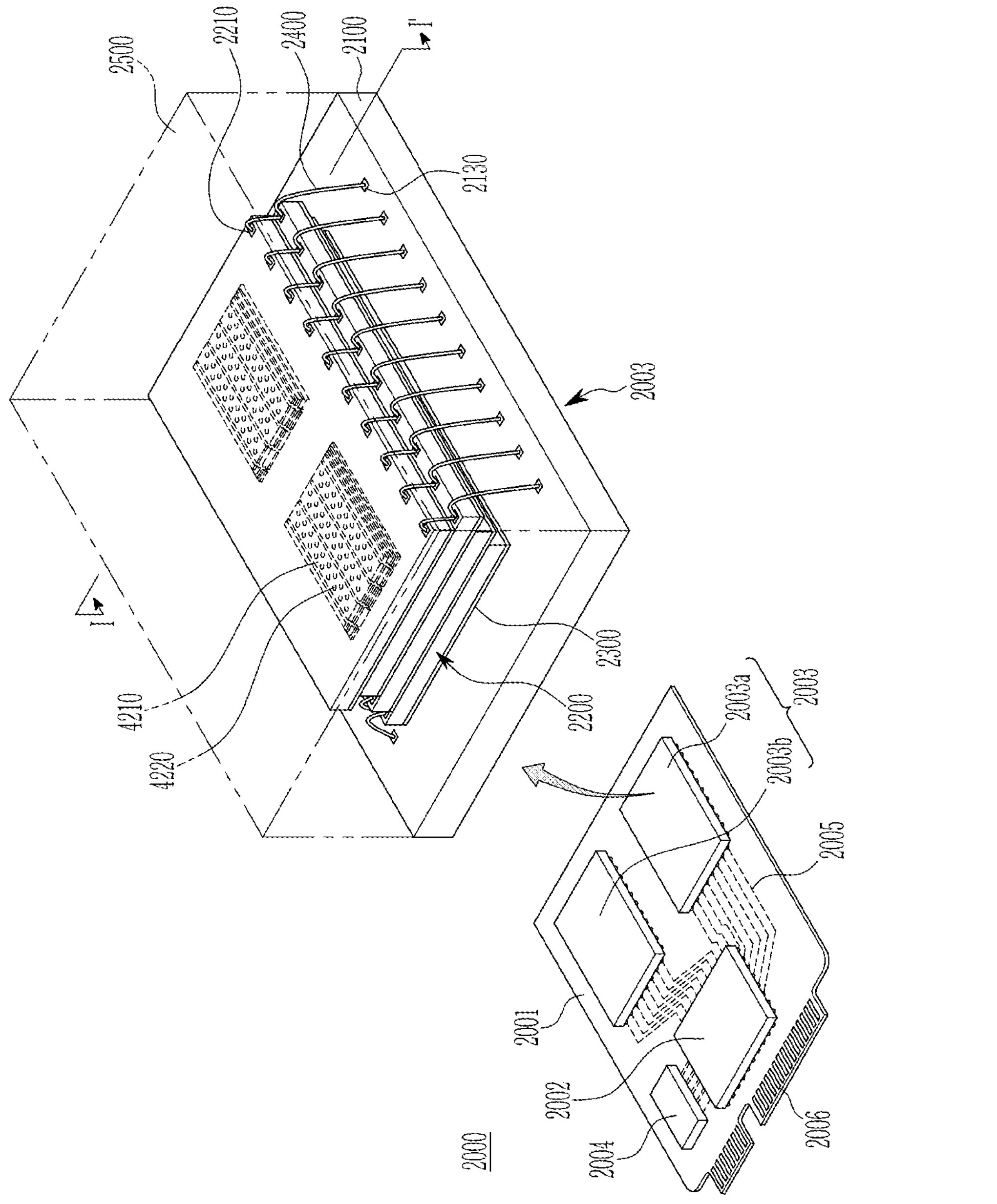
FIG. 11 is a perspective view of an electronic system including a semiconductor device according to an embodiment.

FIG. 11 is a perspective view schematically illustrating an electronic system including a semiconductor device according to an embodiment.

Referring to FIG. 11, an electronic system 2000 according to an embodiment may include a main substrate 2001, a controller 2002, one or more semiconductor packages 2003, and a dynamic random access memory (DRAM) 2004, which are mounted on the main substrate 2001. The semiconductor package 2003 and the DRAM 2004 may be connected to the controller 2002 to each other by a wire pattern 2005 formed on the main substrate 2001.

The main substrate 2001 may include a connector 2006 including a plurality of pins coupled to an external host. The number and arrangement of the plurality of pins in the connector 2006 may vary according to a communication interface between the electronic system 2000 and the external host. In an embodiment, the electronic system 2000 may communicate with an external host according to any one of interfaces, e.g., USB (Universal Serial Bus), PCI-Express (Peripheral Component Interconnect Express), SATA (Serial Advanced Technology Attachment), UFS (Universal Flash Storage) M-Phy, and the like. In an embodiment, the electronic system 2000 may operate by a power supplied from an external host through the connector 2006. The electronic system 2000 may further include a power management integrated circuit (PMIC) that distributes a power supplied from the external host to the controller 2002 and the semiconductor package 2003.

The controller 2002 may write a data to the semiconductor package 2003 or read a data from the semiconductor package 2003, and improve the operation speed of the electronic system 2000.

The DRAM 2004 may be a buffer memory for mitigating a speed difference between the semiconductor package 2003, which is a data storage space, and an external host. The DRAM 2004 included in the electronic system 2000 may also operate as a type of a cache memory, and may provide a space for temporarily storing a data in a control operation for the semiconductor package 2003. When the electronic system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. The first and second semiconductor packages 2003*a* and 2003*b* may be semiconductor packages respectively including a plurality of semiconductor chips 2200. Each of the first and second semiconductor packages 2003*a* and 2003*b* may include a package substrate 2100, a semiconductor chip 2200 on the package substrate 2100, an adhesive layer 2300 disposed on the bottom surface of each semiconductor chip 2200, a connection structure 2400 electrically connect the semiconductor chip 2200 and the package substrate 2100, and a molding layer 2500 covering the semiconductor chip 2200 and the connection structure 2400 on the package substrate 2100.

The package substrate 2100 may be a printed circuit board including an upper pad 2130. Each semiconductor chip 2200 may include an input/output pad 2210. The input/output pad 2210 may correspond to the input/output pad 1101 of FIG. 10. Each of the semiconductor chip 2200 may include a gate stacking structure 4210 and a channel structure 4220. The semiconductor chip 2200 may include the semiconductor device described with reference to FIGS. 1-3, 4A-4I, 5-7, 8A-8E, and 9.

In an embodiment, the connection structure 2400 may be a bonding wire electrically connecting the input/output pad 2210 and the upper pad 2130. Accordingly, in each of the first and second semiconductor packages 2003*a* and 2003*b*, the semiconductor chips 2200 may be electrically connected to each other using a bonding wire method, and may be electrically connected to the upper pad 2130 of the package substrate 2100. According to the embodiment, in each of the first and second semiconductor packages 2003*a* and 2003*b*, the semiconductor chips 2200 may be electrically connected to each other by a connection structure including a through electrode (Through Silicon Via, TSV) instead of the bonding wire type connection structure 2400.

In an embodiment, the controller 2002 and the semiconductor chip 2200 may be included in one package. For example, the controller 2002 and the semiconductor chip 2200 may be mounted on a separate interposer substrate different from the main substrate 2001, and the controller 2002 and the semiconductor chip 2200 may be connected to each other by a wire formed on the interposer substrate.

Figure 12:
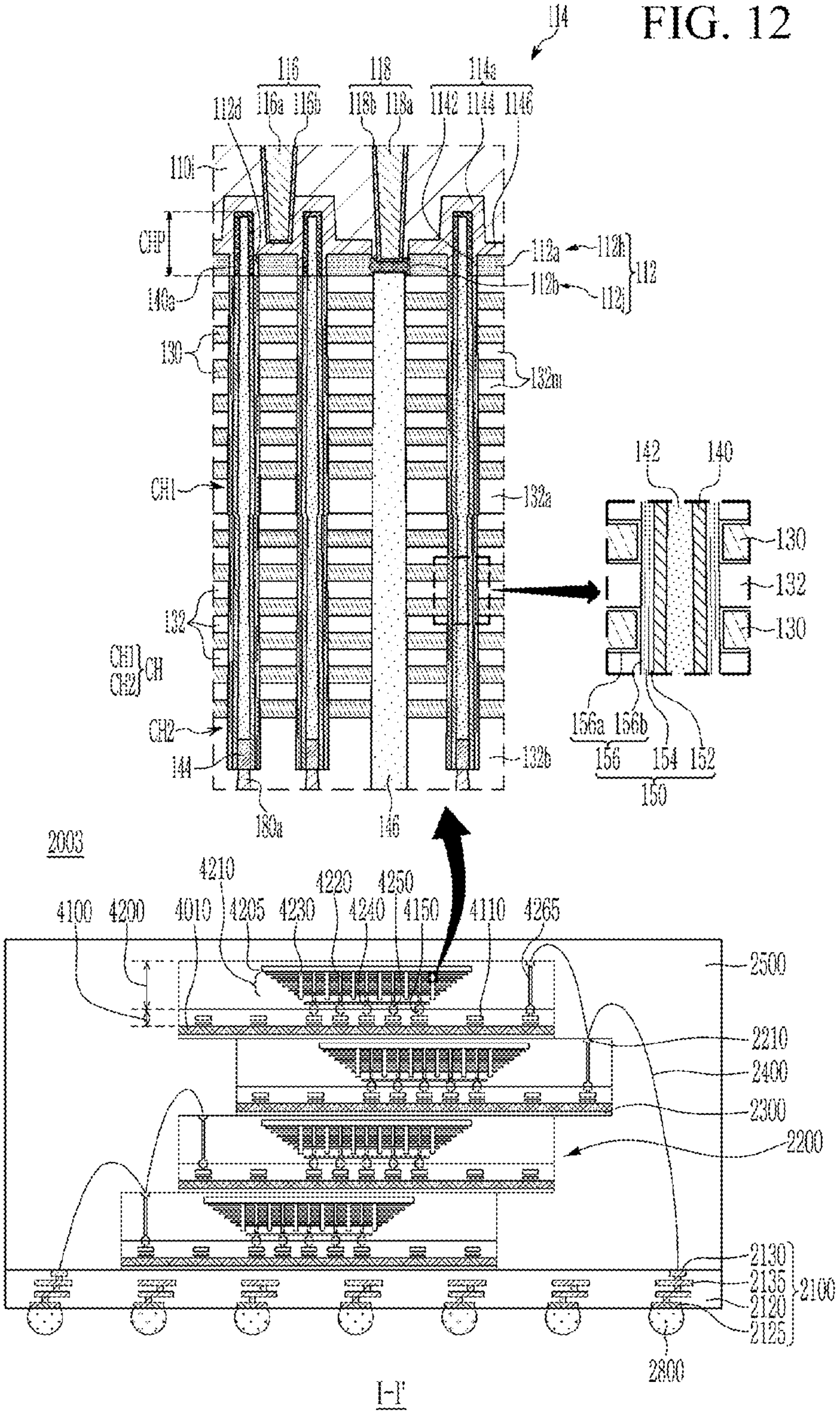
FIG. 12 is a cross-sectional view of a semiconductor package according to an embodiment.

FIG. 12 is a cross-sectional view schematically illustrating a semiconductor package according to an embodiment. FIG. 12 describes an embodiment of the semiconductor package 2003 of FIG. 11 and conceptually represents a region cut along line I-F' for the semiconductor package 2003 of FIG. 11.

Referring to FIG. 12, in the semiconductor package 2003, the package substrate 2100 may be a printed circuit board. The package substrate 2100 may include a package substrate body part 2120, an upper pad 2130 disposed at the upper surface of the package substrate body part 2120, a lower pad 2125 disposed at the lower surface of the package substrate body part 2120 or exposed through the lower surface, and an internal wire 2135 electrically connecting the upper pad 2130 and the lower pad 2125 in the package substrate body part 2120. The upper pad 2130 may be electrically connected to the connection structure 2400. The lower pad 2125 may be connected to the wire pattern 2005 of the main substrate 2001 of the electronic system 2000 like FIG. 11 through a conductive connection 2800.

In the semiconductor package 2003, each semiconductor chip 2200 may include a semiconductor substrate 4010, a first structure 4100 on the semiconductor substrate 4010, and a second structure 4200 bonded to the first structure 4100 by a wafer bonding method on the first structure 4100.

The first structure 4100 may include a peripheral circuit region including a peripheral wire 4110 and a first bonding structure 4150. The second structure 4200 may include a common source line 4205, a gate stacking structure 4210 between the common source line 4205 and the first structure 4100, a channel structure 4220 and a separation structure 4230 penetrating the gate stacking structure 4210, and a second bonding structure 4250 electrically connected to the channel structure 4220 and word lines WL of the gate stacking structure 4210. For example, the second bonding structure 4250 may be electrically connected to the channel structure 4220 and the wordline WL, respectively, through the bitline 4240 electrically connected to the channel structure 4220 and the gate connection wire electrically connected to the wordline WL. The first bonding structure 4150 of the first structure 4100 and the second bonding structure 4250 of the second structure 4200 may be bonded while in contact with each other. The bonding portions of the first bonding structure 4150 and the second bonding structure 4250 may be formed of, e.g., copper (Cu).

In an embodiment, the second structure 4200 includes the horizontal conductive layers 112 and 114 including the doped monocrystalline semiconductor layer 112, thereby improving performance and reliability of the semiconductor device. At this time, since a bulk erase operation may be applied, a stable erase operation may be performed regardless of a number of the gate electrodes 130 or a number of the memory cells.

Each semiconductor chip 2200 may further include an input/output connection wire 4265 under the input/output pad 2210 and the input/output pad 2210. The input/output connection wire 4265 may be electrically connected to a part of the second bonding structure 4250.

In an embodiment, a plurality of semiconductor chips 2200 in the semiconductor package 2003 may be electrically connected to each other by the connection structure 2400 in a form of a bonding wire. As another example, the plurality of semiconductor chip 2200 or a plurality of parts constituting the same may be electrically connected by a connection structure including a through electrode.

By way of summation and review, exemplary embodiments provide a semiconductor device that may improve performance and reliability, a manufacturing method thereof, and an electronic system including the same. That is, according to exemplary embodiments, a horizontal conductive layer may include a doped monocrystalline semiconductor layer and thus may reduce a leakage current, which in turn, may improve performance and reliability of a semiconductor device. Therefore, when a bulk erase operation is applied, a stable erase operation may be performed regardless of a number of gate electrodes or a number of memory cells. In addition, a semiconductor device with excellent performance and reliability may be formed via a simplified and stable process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims:

What is claimed is:

1. A semiconductor device, comprising:
 a gate stacking structure including alternating gate electrodes and insulation layers on an insulation portion;
 a channel structure extending into the insulation portion and extending through the gate stacking structure; and
 a horizontal conductive layer connected to the channel structure between the insulation portion and the gate stacking structure, the horizontal conductive layer including a doped monocrystalline semiconductor layer with a dopant.

2. The semiconductor device as claimed in claim 1, wherein the doped monocrystalline semiconductor layer has a P-type region and an N-type region, the P-type region and the N-type region defining a pn junction.

3. The semiconductor device as claimed in claim 1, wherein:
 the doped monocrystalline semiconductor layer includes a first conductivity type region and a second conductivity type region having a conductivity type opposite to a conductivity type of the first conductivity type region, and
 the semiconductor device further comprises a first contact portion electrically connected to the first conductivity type region through the insulation portion and a second contact portion electrically connected to the second conductivity type region through the insulation portion.

4. The semiconductor device as claimed in claim 3, wherein:
 the first conductivity type region includes a first conductivity type dopant, and
 the second conductivity type region includes the first conductivity type dopant and a second conductivity type dopant, a content of the second conductivity type dopant in the second conductivity type region being higher than a content of the first conductivity type dopant in the second conductivity type region.

5. The semiconductor device as claimed in claim 3, wherein:
 the doped monocrystalline semiconductor layer includes a connection portion connected to the second contact portion, the connection portion including the second conductivity type region,
 the doped monocrystalline semiconductor layer further includes a horizontal portion adjacent to an outer surface of the gate stacking structure, the horizontal portion including the first conductivity type region, and
 the connection portion and the horizontal portion define a pn junction.

6. The semiconductor device as claimed in claim 5, further comprising:
 a separation structure penetrating the gate stacking structure in one direction, and
 the connection portion is adjacent to the separation structure.

7. The semiconductor device as claimed in claim 1, wherein:
 the doped monocrystalline semiconductor layer is spaced apart from the channel structure, and
 the horizontal conductive layer further includes a doped polycrystalline semiconductor layer connecting the doped monocrystalline semiconductor layer and the channel structure.

8. The semiconductor device as claimed in claim 7, wherein:
 the doped monocrystalline semiconductor layer is continuous, except for an opening region in which the channel structure is located, and
 the doped polycrystalline semiconductor layer includes at least a portion connecting a side surface of the channel structure and a side surface of the doped monocrystalline semiconductor layer in a horizontal direction within the opening region.

9. The semiconductor device as claimed in claim 7, wherein:
 the channel structure includes a protruded portion protruding above the gate stacking structure at a portion adjacent to the insulation portion, and
 the protruded portion includes a doped channel layer having a same conductivity type as the doped polycrystalline semiconductor layer.

10. The semiconductor device as claimed in claim 7, wherein:
 the doped polycrystalline semiconductor layer has a first conductivity type,
 the doped monocrystalline semiconductor layer includes a horizontal portion and a connection portion,
 the horizontal portion is adjacent to an outer surface of the gate stacking structure and is composed of a region having the first conductivity type, and
 the connection portion is connected to the horizontal portion and is composed of a region having a second conductivity type opposite to the first conductivity type.

11. The semiconductor device as claimed in claim 7, wherein:
 the doped polycrystalline semiconductor layer has a second conductivity type,
 the doped monocrystalline semiconductor layer includes a horizontal portion and a connection portion,
 the horizontal portion includes a first region and a second region, the first region being adjacent to an outer surface of the gate stacking structure and having a first conductivity type opposite to the second conductivity type, and the second region having the second conductivity type at a surface of the first region, and
 the connection portion is connected to the horizontal portion and is composed of a region having the second conductivity type.

12. The semiconductor device as claimed in claim 7, wherein a thickness of the doped monocrystalline semiconductor layer is greater than a thickness of the doped polycrystalline semiconductor layer.

13. The semiconductor device as claimed in claim 1, wherein a thickness of the doped monocrystalline semiconductor layer is 10 nm to 1 μm.

14. The semiconductor device as claimed in claim 1, wherein a thickness of the doped monocrystalline semiconductor layer is greater than a thickness of each of the insulation layers and the gate electrodes.

15. The semiconductor device as claimed in claim 1, wherein the doped monocrystalline semiconductor layer includes a doped monocrystalline silicon or a doped monocrystalline silicon-germanium.

16. The semiconductor device as claimed in claim 1, further comprising:

a cell region including the gate stacking structure, the channel structure, and the horizontal conductive layer; and a bonding structure bonding the cell region to a circuit region.

17. A manufacturing method of a semiconductor device, the method comprising:

forming a first doped monocrystalline semiconductor layer having a first conductivity type on a semiconductor substrate;

forming a stacking structure on the first doped monocrystalline semiconductor layer, such that the stacking structure includes alternating insulation layers and sacrificial layers;

forming a channel structure penetrating the stacking structure and the first doped monocrystalline semiconductor layer;

forming an opening penetrating the stacking structure to expose a part of the first doped monocrystalline semiconductor layer to form a doped monocrystalline semiconductor layer, such that a first part of the first doped monocrystalline semiconductor layer is not exposed and a second part of the first doped monocrystalline semiconductor layer is exposed;

doping a second conductivity type dopant to the second part of the first doped monocrystalline semiconductor layer, such that the first part of the first doped monocrystalline semiconductor layer is a first conductivity type region and the second part of the first doped monocrystalline semiconductor layer is a second conductivity type region;

replacing the sacrificial layers with gate electrodes such that a gate stacking structure including the gate electrodes and the insulation layers, which are alternating, is formed;

removing the semiconductor substrate; and forming a doped polycrystalline semiconductor layer on the doped monocrystalline semiconductor layer, the channel structure, and the gate stacking structure.

18. The manufacturing method of the semiconductor device as claimed in claim 17, wherein forming the first doped monocrystalline semiconductor layer includes forming a monocrystalline semiconductor layer including silicon or silicon-germanium by using an epitaxial process.

19. The manufacturing method of the semiconductor device as claimed in claim 17, further comprising:

forming an etch-stopping layer and a semiconductor layer on the semiconductor substrate by using an epitaxial process, before forming the first doped monocrystalline semiconductor layer; and removing the etch-stopping layer and the semiconductor layer between removing the semiconductor substrate and forming the doped polycrystalline semiconductor layer, wherein an end of the channel structure is within the semiconductor layer, in forming the channel structure.

20. An electronic system, comprising:

a main substrate;

a semiconductor device on the main substrate; and a controller electrically connected to the semiconductor device on the main substrate, wherein the semiconductor device includes:

a gate stacking structure having alternating gate electrodes and insulation layers on an insulation portion, a channel structure extending into the insulation portion and extending through the gate stacking structure, and a horizontal conductive layer connected to the channel structure between the insulation portion and the gate stacking structure, the horizontal conductive layer including a doped monocrystalline semiconductor layer with a dopant.

* * * * *